US008853520B2

(12) United States Patent
Ueda et al.

(10) Patent No.: US 8,853,520 B2
(45) Date of Patent: Oct. 7, 2014

(54) SOLAR CELL MODULE, ARRANGEMENT STRUCTURE OF THE SAME, AND METHOD FOR ARRANGING THE SAME

(75) Inventors: Yasuhiro Ueda, Ibaraki (JP); Takeharu Yamawaki, Moriyama (JP); Kensuke Ishida, Yasu (JP); Takeharu Nakajima, Izumiotsu (JP); Tadashi Obayashi, Otsu (JP)

(73) Assignee: Kaneka Corporation, Osaka (JP)

( * ) Notice: Subject to any disclaimer, the term of this patent is extended or adjusted under 35 U.S.C. 154(b) by 52 days.

(21) Appl. No.: 13/063,195

(22) PCT Filed: Sep. 2, 2009

(86) PCT No.: PCT/JP2009/065367
§ 371 (c)(1),
(2), (4) Date: Mar. 9, 2011

(87) PCT Pub. No.: WO2010/029883
PCT Pub. Date: Mar. 18, 2010

(65) Prior Publication Data
US 2011/0162689 A1    Jul. 7, 2011

(30) Foreign Application Priority Data

Sep. 10, 2008  (JP) .................. 2008-232221
Sep. 10, 2008  (JP) .................. 2008-232223
Sep. 16, 2008  (JP) .................. 2008-236527
Sep. 30, 2008  (JP) .................. 2008-253483

(51) Int. Cl.
*H01L 31/042* (2014.01)
*H01L 31/048* (2014.01)
*H01L 31/05* (2014.01)

(52) U.S. Cl.
CPC ............ *H01L 31/05* (2013.01); *H01L 31/0485* (2013.01); *Y02E 10/50* (2013.01); *Y02B 10/12* (2013.01); *H01L 31/0482* (2013.01)
USPC ...................................................... 136/244

(58) Field of Classification Search
CPC ............ H01L 31/0422; H01L 31/0424; H01L 31/0482; H01L 31/0484; H01L 31/05; E04D 3/40; E04D 1/30
USPC .................. 136/243–265; 52/173.3
See application file for complete search history.

(56) References Cited

U.S. PATENT DOCUMENTS 7,509,775 B2 * 3/2009 Flaherty et al. .............. 52/173.3

FOREIGN PATENT DOCUMENTS

JP    H11-298017 A    10/1999
JP    2000226908 A  *  8/2000
(Continued)

OTHER PUBLICATIONS

Machine translation of Japanese Patent document 2004-349507A to Tamura.*
(Continued)

*Primary Examiner* — Jeffrey T Barton
*Assistant Examiner* — Eric R Smith
(74) *Attorney, Agent, or Firm* — Alleman Hall McCoy Russell & Tuttle LLP

(57) ABSTRACT

It is an object to provide a solar cell module achieving reduced improper wiring and improved working efficiency.
The present invention provides a solar cell module 10 including a solar cell panel 12, a terminal box 14 housing a plus electrode-connecting terminal in electrical connection with a positive electrode of the panel 12 and a minus electrode-connecting terminal in electrical connection with a negative electrode of the panel 12, a first cable 16 consisting of one of two positive inner wires 24, 24 connected to the plus electrode-connecting terminal and one of two negative inner wires 26, 26 connected to the minus electrode-connecting terminal, in which the wires 24 and 26 are brought together, a second connector 18 consisting of the other of the two positive inner wires 24, 24 and the other of the two negative inner wires 26, 26, in which the wires 24 and 26 are brought together, a first connector 20 connected to the first cable 16, and a second connector 22 connected to the second cable 18, and being characterized in that the first cable 16 is shorter than the second cable 18.

13 Claims, 21 Drawing Sheets

(56) References Cited

FOREIGN PATENT DOCUMENTS

| | | | |
|---|---|---|---|
| JP | 2000-282647 A | 10/2000 | |
| JP | 2000297501 A | 10/2000 | |
| JP | 8042/2003 | 2/2001 | |
| JP | 55815/2001 | 2/2001 | |
| JP | 2001135848 A | * | 5/2001 |
| JP | 9326/2002 | 1/2002 | |
| JP | 2002021276 A | 1/2002 | |
| JP | 2002-083991 A | 3/2002 | |
| JP | 2002289893 A | 10/2002 | |
| JP | 2002-329881 A | 11/2002 | |
| JP | 293536/2003 | 1/2003 | |
| JP | WO03/029577 | 4/2003 | |
| JP | 2003152210 A | 5/2003 | |
| JP | 2004-014920 A | 1/2004 | |
| JP | 2004036242 A | 2/2004 | |
| JP | 2004221151 A | 8/2004 | |
| JP | 2004-349507 A | 12/2004 | |
| JP | 264483/2005 | 9/2005 | |
| JP | 2007186856 A | 7/2007 | |
| JP | 2008021654 A | 1/2008 | |
| JP | 2008-130902 A | 6/2008 | |
| JP | 130902/2008 | 6/2008 | |
| WO | 0204761 A1 | 1/2002 | |
| WO | 03029577 A1 | 4/2003 | |

OTHER PUBLICATIONS

Machine translation of JP2003-393536A to Umeoka.*
Machine translation of JP2000-282657A to Fujihara.*
Machine translation of JP2008-130902 to Maeda.*
Machine translation of JP2000-226908A.*
Machine translation of JP2001-135848A.*

* cited by examiner

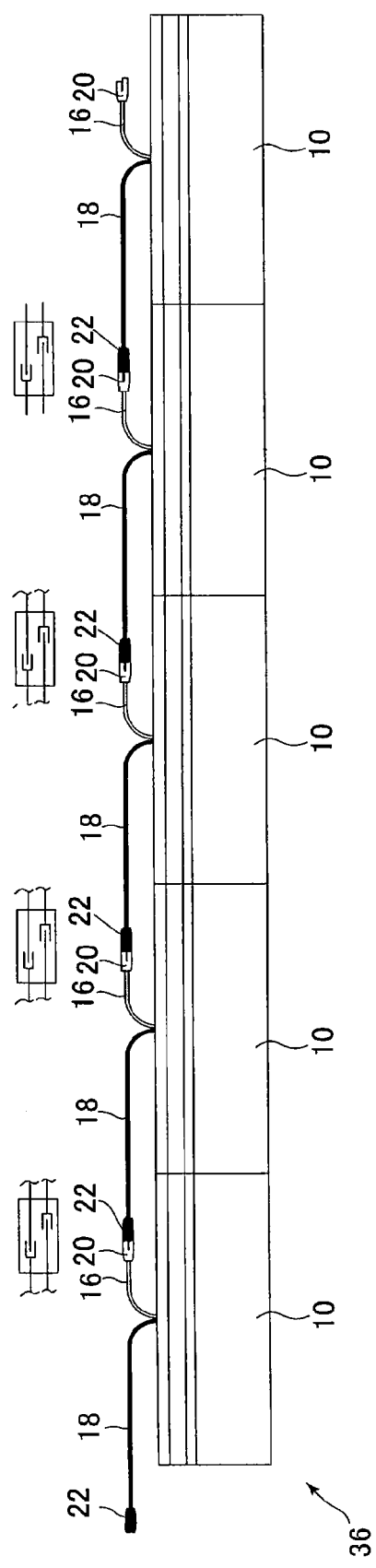

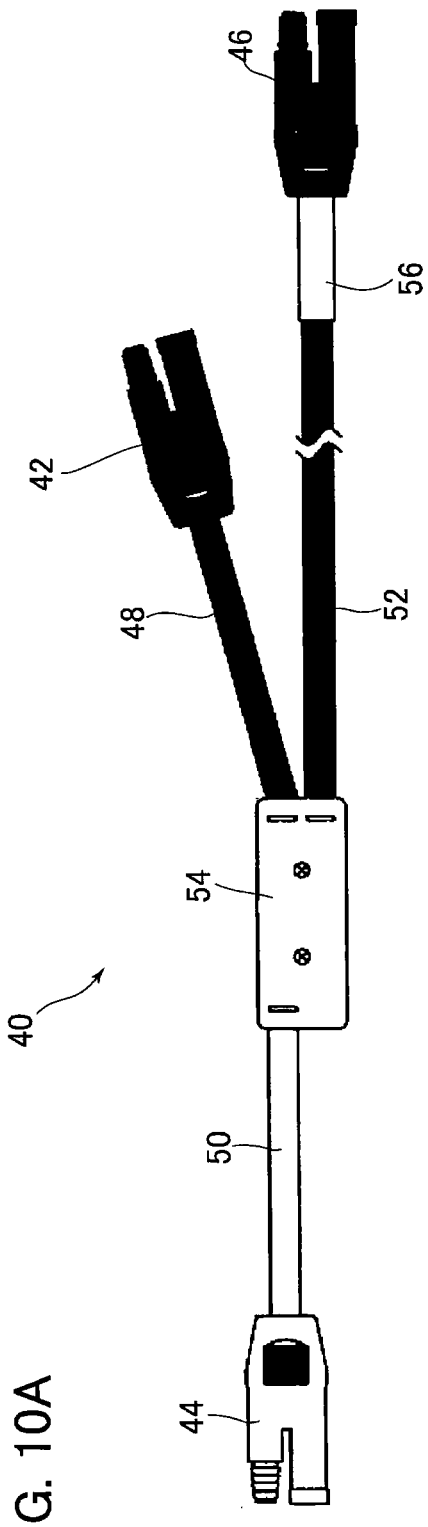
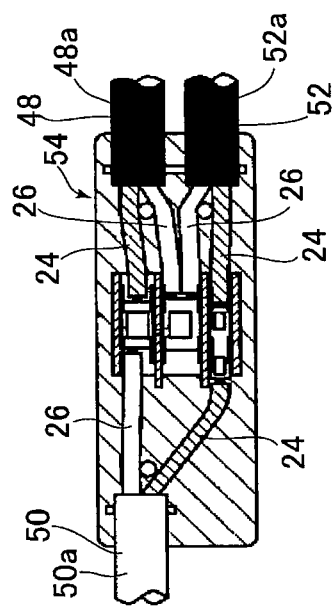
FIG. 10A
FIG. 10B

SOLAR CELL MODULE, ARRANGEMENT STRUCTURE OF THE SAME, AND METHOD FOR ARRANGING THE SAME

TECHNICAL FIELD

The present invention relates to a solar cell module arranged on a wall or a roof of a construction, an arrangement structure using the same, and a method for arranging the same.

BACKGROUND ART

Conventionally, a photovoltaic system with solar cell modules having solar cell panels arranged on a place such as a roof of a house has increased for covering electricity consumed at the house and simultaneously selling surplus electricity to an electric power company. A solar cell panel is an integrated solar cell, which is formed by laminating a film such as a conducting film and a semiconductor film on a glass substrate, cutting a plurality of grooves on the laminated layer so as to form a predetermined number of one-cell batteries (unit solar cells), and electrically connecting the unit solar cells in series. It is known that some panels generate a voltage of 100 volts or more. The Patent Document 1 specified below discloses a method for manufacturing such a solar cell panel.

Though one solar cell module can generate a voltage of 100 volts or more, it generates a low current. Thus, the conventional photovoltaic system has ensured practically enough current by electrically connecting a plurality of solar cell modules in parallel using cables or the like disclosed in the Patent Documents 2 and 3 specified below.

The Patent Document 2 discloses such a configuration that four cables are connected to a solar cell module, and further, such a configuration that a plurality of solar cell modules connected in parallel are connected in series. In the Patent Document 2, a plurality of modules are connected in parallel by directly connecting adjacent cables. In the configurations described in the Patent Document 2, as disclosed in FIG. 8 in the document, the connected cables are housed in a back of the solar cell module from which said cables are pulled out or in a back of the solar cell module in the same level (same row).

The Patent Document 3 discloses such a configuration that four cables are connected to a solar cell module, further, that the cables includes a long one and a short one, and further, that the cables are different in color.

Also in the configurations described in the Patent Document 3, as disclosed in FIG. 7 in the document, the connected cables are housed in a back of the solar cell module from which said cables are pulled out or a back of the solar cell module in the same level (same row).

Further, the known arts relating to the present invention include the Patent Documents 4 to 7 specified below.

In FIG. 25 in the Patent Document 4, such a configuration that conducting wires are pulled out from a longer edge of a solar cell panel is disclosed. However, the conducting wires of a solar cell module described in the Patent Document 4 are short and are not pulled out from the module, judging from a positional relationship of the solar cell panel and a base member 62.

The solar cell module in the Patent Document 4 has two conducting wires, one being a positive wire and the other being a negative wire.

The Patent Documents 5 and 6 each disclose such a configuration that two cables are pulled out from an eaves side of a solar cell module. In the configurations disclosed in the Patent Documents 5 and 6, each of the two cables has only one core and connects the solar cell modules in series.

Also in the configuration described in the Patent Document 5, as disclosed in FIGS. 20 and 21 in the document, the connected cables are housed in a back of the solar cell module from which said cables are pulled out or a back of the solar cell module in the same level (same row).

In the Patent Document 6, the solar cell modules are placed flat and not placed one above the other. Also in the Patent Document 6, most of the cables are housed in a back of the solar cell module from which said cables are pulled out.

The Patent Document 7 discloses such a configuration that two cables are pulled out from a ridge side of a solar cell module. In the configuration disclosed in the Patent Document 7, the cables are wired at a part separate from a part where the solar cell modules are arranged.

The Patent Document 8 has such a configuration that two cables are pulled out from a ridge side of a solar cell module, the cables being connected at a back side of a solar cell module belonging to an adjacent row. In the configuration disclosed in the Patent Document 8, each of the two cables has only one core and connects the solar cell modules in series. The invention described in the Patent Document 8 is characterized in that flat connectors are used. The solar cell module in the Patent Document 8 has a flat main body, at the bottom of which the flat connectors are arranged.

The module in the Patent document 8 is of a rectangular shape with the two cables pulled out from a shorter edge of the module.

[Patent Document 1] JP H11-298017 A
[Patent Document 2] JP 2004-349507 A
[Patent Document 3] JP 2008-130902 A
[Patent Document 4] WO 2003/029577 A1
[Patent Document 5] JP 2000-282647 A
[Patent Document 6] JP2002-329881 A
[Patent Document 7] JP 2002-83991 A
[Patent Document 8] JP 2004-14920 A

DISCLOSURE OF INVENTION

Technical Problem

However, the work of arranging solar cell modules on a place such as a roof of a house is performed in high places and under extreme environment like in hot summer and cold winter. Further, the work requires accuracy so as to prevent an improper wiring in addition to the above-mentioned extreme working environment. Therefore, the work of arranging the modules has had such a problem as a low working efficiency.

The cables disclosed in the Patent Document 2 are substantially the same in length and have both ends with connectors being the same in shape and in color. That might result in an improper wiring because it is hard for workers to tell one cable or connector from another at first glance when the cables in the Patent Document 2 are employed.

Further, discrete wirings arranged for connecting the solar cell modules using the cables disclosed in the Patent Document 3 might result in breaking of wires because the cables get hung up on an unexpected place. When a plurality of conducting wires (wiring) bundled as a two-core cable in the known art are used, there has had a problem of difficult wiring because the bundled wires are rigid but difficult to bend unless the cables are long enough. Meanwhile, longer cables more than necessary in view of easy bending must ensure a space for accommodating excess cables, resulting in a problem of lower working efficiency.

Still further, as the cables disclosed in the Patent Document 2, if the two electrically-connected cables are substantially the same in length while the cables are adjusted in length so as to have no excess cable, the cables not being very long are forcedly bent and wired at a middle portion of the two modules. That largely puts stress resulting from bending on a connected portion of the connector and each cable and/or a connected portion of a terminal box and each cable, resulting in possibly being breakable.

The cables disclosed in the Patent Documents 2 and 3 each are for connecting adjacent solar cell modules in parallel, being constituted by four conducting wires including two positive wires and two negative wires, resulting in a large total volume of the cables.

Nevertheless, in the configuration disclosed in the Patent Documents 2 and 3, the cables are connected at the back of the solar cell module from which said cables are pulled out, as described above.

That is, the solar cell modules are arranged over a number of rows with spreading in a planar state in most cases when being arranged on a roof.

More specifically, the solar cell modules are arranged in rows in parallel to eaves and a ridge, not in one row but in a plurality of rows. In the inventions described in the Patent Documents 2 and 3, the cables connect adjacent modules in the same row (right and left modules toward a roof). Specifically, the cables in the Documents 2 and 3 are connected to the cables of adjacent right and left modules with passing through the back of the boundary between the modules. More specifically, the cables are pulled out in the right and left directions toward the roof, so as to be connected to the cables of the adjacent modules arranged on the right and left hands. Thus, the cables always exist under the row of the modules from which said cables are pulled out, so as to be prevented from hanging out of the row of the modules.

That forces to connect the cables in a narrow space between the back of the modules and a roof of a construction, which space is formed by lifting or tilting the modules.

Consequently, the work of arranging the solar cell modules on a place such as a roof of a house is inefficient.

In terms of the above-mentioned problems of the known art, the present invention therefore aims to provide a solar cell module achieving reduced improper wiring and improving working efficiency, an arrangement structure of the same, and a method for arranging the same.

Solution to Problem

In order to solve the above-mentioned problem, an aspect of the present invention provided herein is a solar cell module including a solar cell panel formed in a substantially rectangular plane with longer edges and shorter edges by electrically connecting a plurality of unit solar cells in series, a first cable and a second cable being different in length and each having more than one conducting wire, two connectors consisting of a first connector connected to an end of the first cable and a second connector connected to an end of the second cable and being connectable by engagement with the first connector, two positive conducting wires in electrical connection with a positive electrode of the solar cell panel, and two negative conducting wires in electrical connection with a negative electrode of the solar cell panel, the first cable having two conducting wires consisting of one of the two positive conducting wires and one of the two negative conducting wires and arranged in an insulation tube, and the second cable having two conducting wires consisting of the other of the two positive conducting wires and the other of the two negative conducting wires and arranged in an insulation tube.

Another recommended aspect of the present invention is a solar cell module including a solar cell panel formed in a substantially rectangular plane by electrically connecting a plurality of unit solar cells in series, a plus electrode-connecting terminal in electrical connection with the positive electrode of the panel, a minus electrode-connecting terminal in electrical connection with the negative electrode of the panel, a first cable and a second cable being different in length and each having more than one conducting wire, two connectors consisting of a first connector connected to an end of the first cable and a second connector connected to an end of the second cable and being connectable by engagement with the first connector, two positive conducting wires connected to the plus electrode-connecting terminal, and two negative conducting wires connected to the minus electrode-connecting terminal, the first cable having two conducting wires consisting of one of the two positive conducting wires and one of the two negative conducting wires and arranged in an insulation tube, the second cable having two conducting wires consisting of the other of the two positive conducting wires and the other of the two negative conducting wires and arranged in an insulation tube, wherein the first cable is shorter than the second cable, and wherein the first and the second connectors each include a positive terminal connected to the positive conducting wire, a negative terminal connected to the negative conducting wire, a male portion, and a female portion connectable by engagement with the male portion, the first and the second connectors are composed of one provided with the positive terminal formed in the male portion and the negative terminal formed in the female portion and the other provided with the negative terminal formed in the male portion and the positive terminal formed in the female portion.

The above-mentioned solar cell module facilitates rapid determination whether the connecter connected to the cable is the first connector or the second connecter by a length of said cable. Thus, the above-mentioned module allows workers to rapidly select an appropriate connector, thereby reducing improper wiring and improving working efficiency compared to the conventional solar cell modules.

In the above-mentioned module, the first and the second cables each are configured by a cable consisting of more than one conducting wire, like a two-core cable, thereby minimizing the number of the cables. Thus, the above-mentioned module simplifies electric wirings in arrangement on a structural object such as a roof and avoids a problem such as breaking of wire caused by hooking of the cables into an unexpected place.

In the above-mentioned module, the first and the second cables are each configured by bundling the two conducting wires, thereby having high rigidity. Thus, the above-mentioned module reduces the possibility of breaking of the first and the second cables. In the above-mentioned module, the second cable is longer than the first cable, so as to have a high flexibility of wiring. Thus, the above-mentioned module is arranged without bending of the first cable too largely by drawing the flexible second cable toward the first cable, so that the first and the second cables are much less subjected to stress by being bent. Consequently, the module is easily arranged without providing the first and the second cables longer than necessary and reduces a problem such as breaking of the cables.

Further, the solar cell module has a substantially rectangular shape with longer edges and shorter edges, the first and the second cables being pulled out from one of the longer edges of the module, wherein the solar cell panel has a length L1 of the longer edges and a length L4 of the shorter edges, the second cable having a pulled-out portion being of a length X longer than (L1/2) and longer than L4, the first cable having a pulled-out portion being of a length Y shorter than a length of the second cable and shorter than (L1/2).

In this aspect, the first and the second cables are pulled out from the longer edge of the module, which has a substantially rectangular shape. That allows connection of the cables outside a body of the module. The modules belonging to an adjacent row are arranged on the previously-connected cables by placing said modules after the connection of the cables.

The solar cell modules are connected to the solar cell modules belonging to an adjacent row by satisfying the above-mentioned formulae.

As described above, the solar cell modules are arranged over a number of rows with spreading in a planar state in most cases when being arranged on a roof Consequently, when the modules are electrically connected, it is necessary to connect the cables to not only adjacent modules located on the right and left hands but also the modules belonging to adjacent rows (upper and lower rows in a case of an inclined roof).

Though the length X of the second cable is longer than the length Y of the first cable in this aspect, in a case where the length X of the longer second cable is longer than the length L4 of the shorter edges of the solar cell panel, the second cable passes through the back of and is pulled out from the module belonging to an adjacent row. That allows electrical connection with the modules belonging to the adjacent row. Herein, the second cable has the length X of 50% or more of the length L1 of the shorter edges of the module, so as to be connected to the cable of an adjacent module on the right and left hands.

The modules 10 are often arranged in a staggered manner, which may shift the modules belonging to an adjacent row from the modules having previously arranged. Therefore, the length X is preferably longer than a sum of (L1/4) and L4 and shorter than a sum of ((L1/4)×3) and L4.

The length Y is preferably shorter than a length L2 of the shorter edges of the module.

More preferably, the length Y is shorter than L4.

When the length Y of the shorter first cable is shorter than the length L2 of the shorter edges of the module, the first cable is unconnectable to the cable of the module belonging to an adjacent row, so as to be protected from improper wiring. When the length Y of the first cable is shorter than the length L4 of the shorter edges of the panel, improper wiring is surely prevented.

The first connector and the second connector are preferably different in pattern and/or color.

According to this configuration, workers rapidly determine the kind of the connector by confirming a shape, pattern, color, or a combination of these (hereinafter referred to as a form) of said connector. Thus, the module in this configuration allows workers rapid selection of an appropriate connector, thereby reducing improper wiring and having high working efficiency compared with the conventional solar cell modules.

The first cable and the second cable are preferably different in pattern and/or color.

According to this configuration, workers rapidly determine the kind of the connector connected to the cable by confirming pattern, color, or a combination of these of said cable. Thus, the module in this configuration allows workers rapid selection of an appropriate connector, thereby reducing improper wiring and having high working efficiency compared with the conventional solar cell modules.

In the above-mentioned module, the positive conducting wires and the negative conducting wires may be different in pattern and/or color.

It is preferable that the solar cell panel is of a substantially rectangular shape, wherein the first and the second cables are pulled out from a substantial center part of the longer edge of the panel, and wherein, when two solar cell modules are arranged by adjacently connecting the shorter edges of the panels, the first connector of one of the modules is unconnectable to the first connector of the other of the modules because the cables are not long enough.

According to this configuration, the first connector of the solar cell module is unconnectable to the first connector of its adjacent module. That surely avoids improper connection of wiring.

The solar cell module preferably has a space for accommodating the connected cables and connectors in a back of the module.

This configuration makes the connected cables fit into place, thereby facilitating the arrangement work.

For the similar reason, the solar cell module preferably has grooves through which the cables are inserted in a shorter-edge direction at the back of the module.

A further aspect of the present invention provided in order to solve the similar problem is a solar cell module with a plurality of unit solar cells formed inside thereof so as to constitute a solar cell as a whole, including two connectors and cables, the cables each having more than one conducting wire and pulled out from a center part of a longer edge of the module, the two connectors each having more than one individual terminal and being connected to the respective cables, wherein the one terminal of each connector is a positive terminal connected to a positive electrode of the solar cell and the other terminal of each connector is a negative terminal connected to a negative electrode of the solar cell, wherein the cable connected to the one connector is shorter than the cable connected to the other connector, wherein, when a plurality of the modules are arranged in a row, the cables have a length relationship in which the connectors connected to the short cables are unconnectable to each other because the cables are not long enough, and wherein the connector connected to the long cable and the connector connected to the short cable are connected to each other with the positive terminals of the both connectors connected to each other and with the negative terminals of the both connectors connected to each other, so as to electrically connect the modules in parallel.

It is preferable that the long cable passes through a back of and to an outside of a solar cell module in an adjacent row, so as to connect the connector connected to the long cable with the connector connected to the short cable of the module in the adjacent row.

The short cable preferably has a length being unable to come through the back of and to the outside of the module in the adjacent row.

When the solar cell modules described above are arranged, the connectors of the adjacent module are connected in such a manner that the connector connected to the long cable and the connector connected to the short cable are connected to each other. In an arrangement structure of the above-mentioned solar cell modules, it is normal that the connector connected to the long cable and the connector connected to the short cable are connected to each other in this way. According to the module in this aspect, connection of the connector connected to the long cable and the connector connected to the short cable in connection of adjacent modules in this way achieves connection of the positive terminals and connection of the negative terminals of the both connectors. That electrically connects a plurality of the modules in parallel.

The arrangement structure of the above-mentioned modules prevents workers from improper connection of the connectors. Since the module described above has the long and short cables, the connectors connected to the short cables are unconnectable to each other because of lack of length when arranged with the other modules in a row. Therefore, when the modules are arranged on a structural object such as a roof, the short cables of adjacent modules are physically unconnectable to each other. That prevents workers from improper connection of the connectors.

The above-mentioned module employs a cable consisting of more than one conducting wire brought together, so that each cable has high rigidity compared with cables discretely arranged as disclosed in the patent document 3 (JP 2008-130902 A) presented as the conventional art. Therefore, the above-mentioned module reduces the possibility of breaking of the cables. Further, in the above-mentioned module, the cables are different in length, unlike the cables as disclosed in the patent document 2 (JP 2004-349507 A) presented as the conventional art. Therefore, the above-mentioned aspect brings about a high flexibility of wiring of the longer cable. Consequently, the module allows the flexible long cable to be bent halfway and drew toward the short cable, so that a proximal end portion or a portion connected to the connector of the long cable is much less subjected to stress. Further, when the cables being different in length are connected in this way, the long cable comes adjacent to the short cable, and thus the short cable is not forced to be bent. Consequently, the above-mentioned module is easily arranged without providing each cable longer than necessary and reduces a problem such as breaking of the cables.

Further, according to the above-mentioned aspect, the module is electrically connected to the other modules belonging to an adjacent row without failure.

In the above-mentioned module, the cables connected to the one and the other connectors each may consist of two conducting wires arranged in an insulation tube.

In a case where the cables each consisting of two conducting wires brought together and arranged in the insulation tube as the above-mentioned module, the cables have high rigidity and the reduced possibility of breaking of the cables compared with the cables discretely arranged as disclosed in the patent document 3 (JP 2008-130902 A). Meanwhile, higher rigidity of the cables might cause larger stress acting on the proximal end portion or the portion connected to the connectors of the cables by bending of the cables. However, the cables in the present aspect are different in length, unlike the cables as disclosed in the patent document 2 (JP 2004-349507 A), one being long and the other being short. Thus, it is not necessary to force either cable to be bent, so that the proximal end portion or the portion connected to the connector of the cables is not much less subjected to stress. Consequently, the present aspect prevents not only breaking of wires caused by lack of strength of the cables but also breaking of wires caused by stress acting on the above-mentioned portions of the cables by bending of the cables.

The connectors preferably have the same configuration but are different in color.

The connectors employed herein have the same configuration, so as to be manufactured by using a die having the same configuration.

Though the connectors employed herein are indistinguishable just by looking because of the same configuration, workers know which ones are to connect through instinct without looking a configuration or the like of the connectors since the connectors are different in color. Consequently, by the module in this aspect, workers immediately determine the connectors to connect and surely avoid improper connection. Even if improper connection of the connectors would happen, workers readily find out that by eye.

Herein, in a case where the cables are different in length as described above, it is possible to distinguish which cable it is by a comparison of those lengths. However, in view of convenience when a number of modules are arranged, it is preferable to distinguish which cable it is through instinct without a comparison of the lengths.

A further aspect of the present invention provided in such a view is the solar cell module having a configuration in which the long cable and the short cable are different in color.

By this configuration, workers distinguish whether the cable is long or short through instinct just by looking the color of said cable.

In the module in the above-mentioned aspect, it is preferable that the long cable has a length of 50% or more of a total length of the solar cell module and the short cable has a length of less than 50% of the total length thereof.

An aspect relating to an arrangement structure of solar cell modules is characterized in arranging a plurality of any solar cell modules as described above in a plurality of rows, wherein the one or the first connector and the other or the second connector each having the positive terminal and the negative terminal, and wherein the terminals having the same polarity of the first connector of one of adjacent solar cell modules and of the second connector of the other of the adjacent modules are connected to each other, so that the adjacent solar cell modules are electrically connected in parallel so as to form a solar cell block.

The above-mentioned arrangement structure allows adjacent modules to be electrically connected in parallel only by connecting the first connector of one of the adjacent modules and the second connector of the other of the adjacent modules, thereby facilitating the arrangement work. Even if one solar cell module can generate a low current, the arrangement structure in this aspect enables parallel connection of a plurality of modules, thereby ensuring practically enough current.

The above-mentioned arrangement structure preferably has a service cable for connecting a plurality of the solar cell blocks in series and drawing wirings in a building.

By this configuration, even if one solar cell block generates a low voltage, the above-mentioned arrangement structure ensures a predetermined voltage by connecting a plurality of the solar cell blocks in series.

The arrangement structure described above may be characterized in including two of the solar cell blocks, wherein the service cable includes a first serial connector connected to the first connector unused in one of the solar cell blocks, a second serial connector connected to the second connector unused in the other of the solar cell blocks, an output connector for outputting electricity converted by the solar cell panels, a first outdoor cable including positive and negative conducting wires and connected to the first serial connector, a second outdoor cable including positive and negative conducting wires and connected to the second serial connector, and an indoor cable including positive and negative conducting wires and connected to the output connector, the one conducting wire of the first outdoor cable being connected to the one conducting wire with a reversed polarity of the second outdoor cable, the other conducting wire of the first outdoor cable being connected to the one conducting wire with the same polarity of the indoor cable, and the other conducting wire of the second outdoor cable being connected to the other conducting wire of the indoor cable.

The first serial connector and the second serial connector are preferably different in pattern and/or color.

By this configuration, workers immediately distinguish the kind of the connector by confirming the form of said connector of the service cable. Consequently, the present aspect reduces improper wiring and achieves high working efficiency.

The first outdoor cable and the second outdoor cable are preferably different in pattern and/or color.

By this configuration, workers immediately distinguish the kind of the connector connected to the cable by confirming pattern, color, or a combination of these of said outdoor cable. Consequently, the present aspect reduces improper wiring and achieves high working efficiency.

A further aspect relating to the arrangement structure of solar cell modules is characterized in using solar cell modules each being of a rectangular shape and having a plurality of unit solar cells formed inside thereof so as to constitute a solar cell as a whole, and being for arranging the solar cell modules on a building, wherein the solar cell modules each include two connectors and cables, the cables each having more than one conducting wire and pulled out from a center part of a longer edge of the module, the two connectors each having more than one individual terminal and being connected to the respective cables, wherein the one terminal of each connector is a positive terminal connected to a positive electrode of the solar cell and the other terminal of each connector is a negative terminal connected to a negative electrode of the solar cell, wherein the cable connected to the one connector is shorter than the cable connected to the other connector, wherein, when the modules are arranged in a row, the cables have a length relationship in which the connectors connected to the short cables are unconnectable to each other because the cables are not long enough, and wherein the modules are arranged in a row on a building, the connector connected to the long cable of one of adjacent modules and the connector connected to the short cable of the other of the adjacent modules being connected to each other at outside of the row of the modules with the positive terminals of the both connectors connected to each other and with the negative terminals of the both connectors connected to each other, thereby electrically connecting a plurality of the modules in parallel.

In the arrangement structure in the above-mentioned aspect, the connector connected to the long cable and the connector connected to the short cable are connected to each other in the adjacent modules. In the arrangement structure in the above-mentioned aspect, it is normal that the connector connected to the long cable and the connector connected to the short cable are connected to each other in this way. According to the arrangement structure described above, connection of the connector connected to the long cable and the connector connected to the short cable of adjacent modules in this way achieves connection of the positive terminals and connection of the negative terminals of the both connectors. That electrically connects a plurality of modules in parallel.

Further, the arrangement structure described above prevents workers from improper connection of the connectors. Because of the short and long cables in this way, the connectors connected to the short cables are unconnectable to each other due to lack of length when the modules are arranged in a row. Therefore, when the modules are arranged on a structural object such as a roof, the short cables of adjacent modules are physically unconnectable. That prevents workers from improper connection.

Further, the arrangement structure described above employs the cables each consisting of more than one conducting wire brought together so as to electrically connect the solar cell modules. Therefore, each cable has high rigidity compared with the cables discretely arranged as disclosed in the patent document 3 (JP 2008-130902 A) presented as the conventional art. Consequently, the arrangement structure described above provides high strength to the cables, thereby reducing the possibility of breaking of wires.

Still further, the cables employed in the arrangement structure described above are different in length, unlike the cables as disclosed in the patent document 2 (JP 2004-349507 A) presented as the conventional art. Therefore, employment of the arrangement structure described above brings about a high flexibility of wiring of the longer cable in arrangement even though such a cable having high rigidity as described above is employed. Consequently, the arrangement structure described above electrically connects the cables by bending the flexible long cable halfway and drawing toward the short cable, thereby avoiding forced bending of the short cable. Thus, by employment of the arrangement structure described above, a proximal end portion or a portion connected to the connector of the long cable is much less subjected to stress. Further, the above-mentioned arrangement structure easily wires and electrically connects the cables without providing each cable longer than necessary, thus being excellent in arrangement.

In the arrangement structure described above, the cables connected to the one and the other connectors each may consist of two conducting wires arranged in an insulation tube.

As in this aspect, each cable consisting of two conducting wires arranged in one insulation tube has high rigidity and the reduced possibility of breaking of wires compared with the cables discretely arranged as disclosed in the patent document 3 (JP 2008-130902 A). Meanwhile, higher rigidity of the cables might cause difficulty in bending of the cables and larger stress acting on the portions described above of the cables by bending of the cables. However, the cables in the present aspect are different in length, unlike the cables as disclosed in the patent document 2 (JP 2004-349507 A), one being long and the other being short. Thus, it is not necessary to force either cable to be bent with easy wiring of that, so that the portions described above is not much less subjected to stress. Consequently, the present aspect prevents not only breaking of wires caused by lack of strength of the cables but also breaking of wires at the proximal end portion or the portion connected to the connector of the cables caused by stress acting thereon by bending of the cables.

The connectors provided in the module preferably have the same configuration but are different in color.

The two connectors provided in the module making up the arrangement structure in this aspect have the same configuration. For this reason, the connectors are indistinguishable just by looking the configurations of those in arrangement of the modules. However, the two connectors described above in this aspect are different in color, and whereby workers know which ones are to connect through instinct just by paying attention to the difference of color in the arrangement. Consequently, the arrangement structure in this aspect avoids workers from improper connection caused by mixing up the connectors. Even if improper connection of the connectors would happen, workers readily find out that by eye and prevent remaining of the improper connection before completion of the arrangement work of the modules.

The long cable and the short cable of the module are preferably different in color.

By this configuration, workers distinguish whether the cable is long or short through instinct just by looking the color of said cable in arrangement of the modules. Consequently, employment of the arrangement structure in this aspect allows workers to distinguish the cable being long or short through instinct just by looking at the color of said cable, thereby reducing the possibility of improper connection.

In the arrangement structure described above, it is preferable that the long cable of the module has a length of 50% or more of a total length of the module and the short cable thereof has a length of less than 50% of the total length thereof.

It is preferable that the connectors provided in the modules consist of a first connector and a second connector, either the first connector or the second connector having no connection with the service cable among the first or the second connector unused in the solar cell block being attached with a terminal protector.

This aspect efficiently protects also the terminal of the connector not being connected to another connector from attachment of dust or water due to being exposed to outside.

It is preferable that the module has a space for accommodating the connected cables and connectors in a back thereof and that a plurality of the modules are arranged in a plane in a plurality of rows each consisting of the modules, the long cable of one of adjacent modules being connected to the short cable of the other of the adjacent modules with the long cable and the short cable housed in the space of the module in an adjacent row.

According to the arrangement structure in this aspect, the cables are connected outside a body of the module, and further, the previously-connected cables are housed in the space of the modules belonging to the adjacent row, which are arranged after the cables have been connected.

Further, it is preferable that a plurality of the modules are arranged in a plane in a plurality of rows each consisting of the modules, the long cable being pulled to the right toward a roof so as to be connected to the short cable of the panel located to the immediate right in one row, and the long cable being pulled to the left toward the roof so as to be connected to the short cable of the panel located to the immediate left in the adjacent row.

This aspect prevents improper connection of the cables;

The long cable of the solar cell module located at an end of the row preferably comes through a back of and to an outside of the module in the adjacent row, so as to be connected to the short cable of the module located at an end of the adjacent row.

It is preferable that the long cable of the module located at the end of the row and the short cable of the module located at the end of the adjacent row are connected and housed in the space of the module of the next row but one.

A further aspect of the present invention relating to a method for arranging solar cell modules is characterized in using the solar cell modules constituting the arrangement structure described above, the two connectors provided in each of the modules consisting of a first connector and a second connector and in attaching the terminal protector to the unused first connector or second connector when the arrangement work of the arrangement structure is interrupted.

This aspect efficiently protects the terminals of the connectors of the modules from attachment of dust and water during the arrangement work.

Advantageous Effect of Invention

The present invention provides a solar cell module achieving reduced improper wiring and improved working efficiency, an arrangement structure of the same, and a method for arranging the same.

BRIEF DESCRIPTION OF DRAWINGS

FIG. 6 is a conceptual diagram showing a module row in which the solar cell modules are properly connected;

FIG. 10A is a front view of a service cable and FIG. 10B is a cross-section of a molded portion of the service cable;

FIG. 16A shows a state before the arrangement and FIG. 16B shows a state after the arrangement;

DESCRIPTION OF EMBODIMENTS

Now, a solar cell module embodying the present invention will be described in detail below, making reference to the accompanying drawings. In the descriptions below, a vertical positional relationship is based on a positional relationship shown in FIG. 1.

Figure 14:
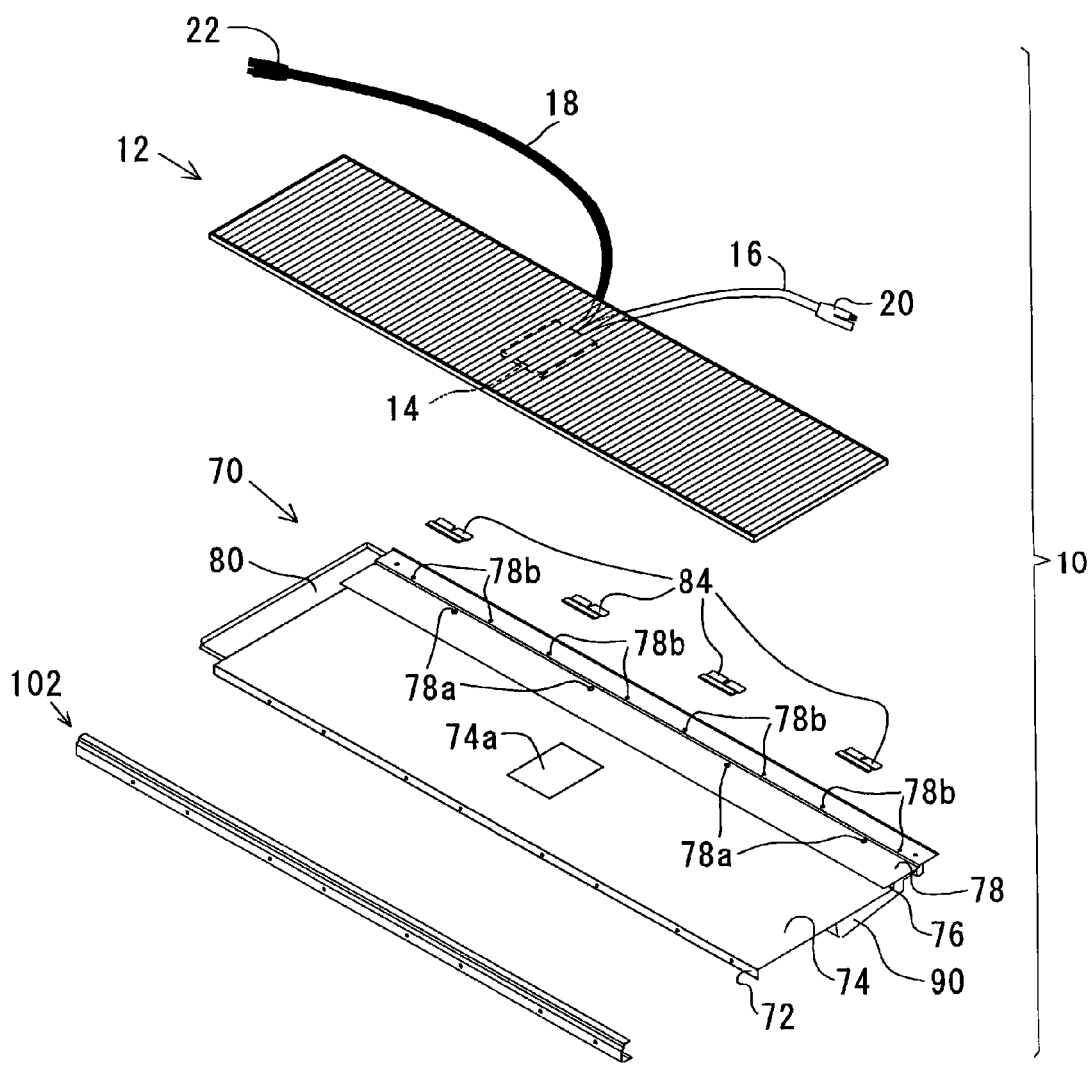
FIG. 14 is an exploded perspective view of the solar cell module in FIG. 1.

As shown in FIGS. 1A and 14, a solar cell module 10 consists mainly of a base 82 constituted by a base member 70 attached with a reinforcing heat insulator 90 and other members such as a solar cell panel 12, a front cover 102, and hooking brackets 84 mounted on the base 82.

The module 10 in the present embodiment is a roof-tile-shaped solar cell module applied to a roof R of a newly-built or already-built house. As shown in FIGS. 1A to 1C and 2, the solar cell module 10 is provided with the solar cell panel 12, a terminal box 14 attached to a back of the panel 12, two cables 16 and 18 pulled from the terminal box 14, and connectors 20 and 22 connected to the respective cables 16 and 18.

It is preferable that the module 10 has a total length of a longer edge of 920 to 1200 mm and a total length of a shorter edge of 240 to 700 mm.

It is preferable that the panel 12 mounted on the module 10 has a length of a longer edge of 900 to 1200 mm and a length of a shorter edge of 230 to 650 mm.

Next, recommendable sizes of the module 10 and the panel 12 will be described below, each being a size in the embodiment shown in FIG. 1A and the followings.

Figure 1:
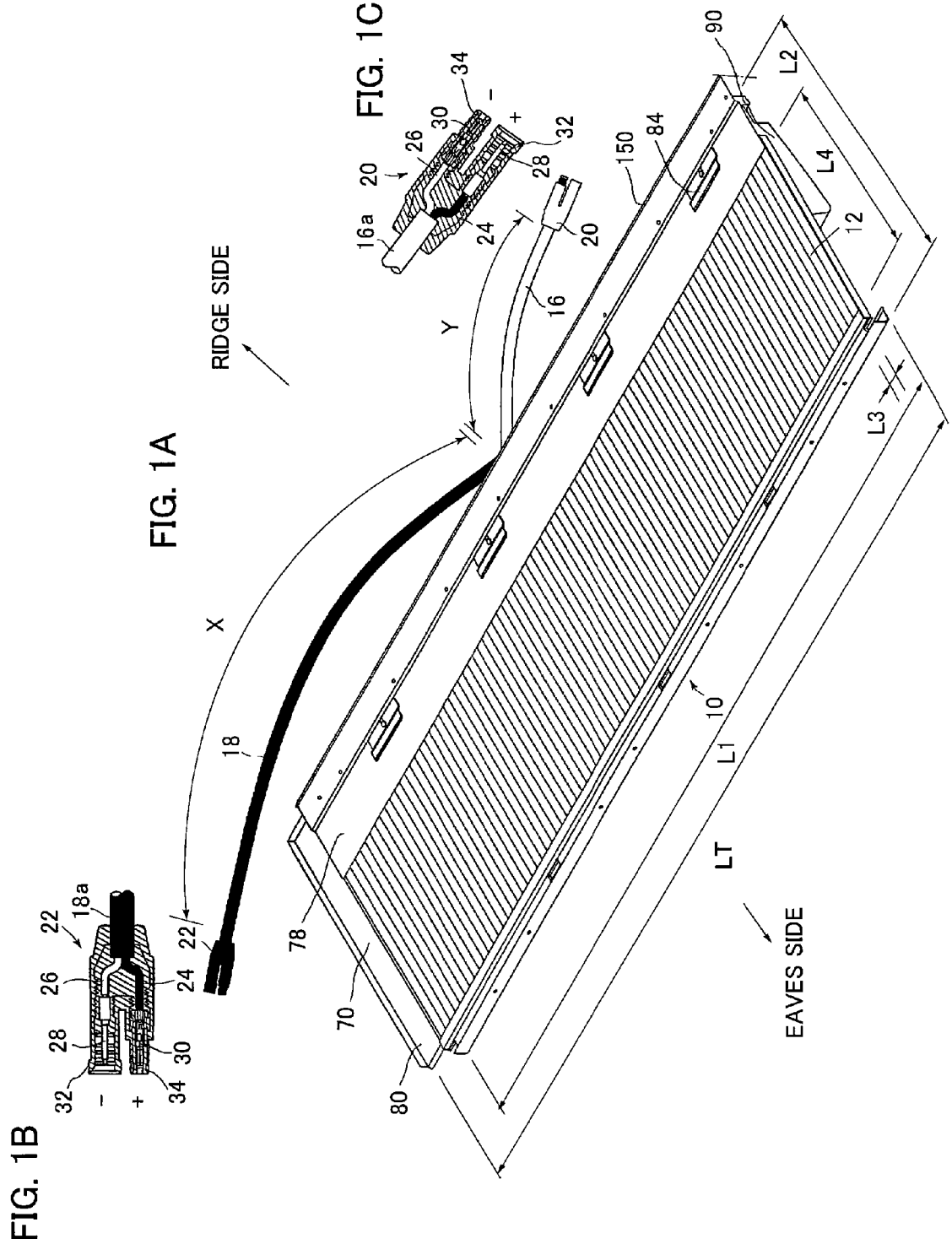
FIG. 1A is a perspective view of a solar cell module embodying the present invention and FIGS. 1B and 1C each are a cross-section of a connector in the solar cell module.
Figure 2:
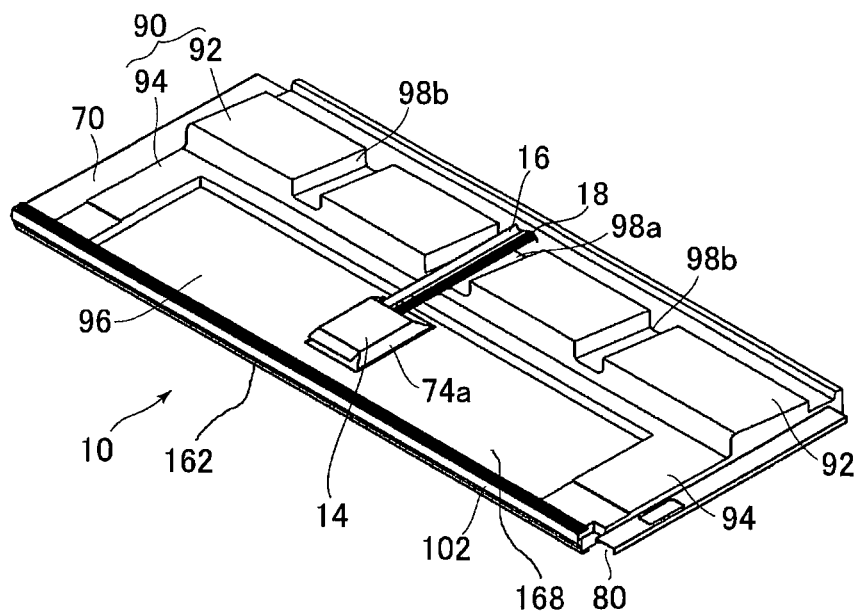
FIG. 2 is a perspective view showing a structure of a back of the module in FIG. 1.

The solar cell module 10 is formed in a substantially rectangular plane as shown in FIGS. 1A and 2. In the module 10, most of area exposed outside when the module 10 is arranged is occupied by the panel 12. Therefore, the module 10 has substantially the same size as or slightly larger than the panel 12. In this embodiment, a total length LT of the module 10 is longer than a total length L1 of the panel 12 by a width of a trough-like gutter 80.

The module 10 in this embodiment has the total length LT of the longer edge smaller than 1200 mm in view of ensuring output and simultaneously workability in arrangement work on a house. Herein, the total length LT of the module 10 excludes lengths of the cables 16 and 18.

In this embodiment, the panel 12 has the total length L1 in a range of 900 to 1100 mm in view of an interval of common scaffolds laid in arrangement of the module 10 and easy handling by workers.

The panel 12 has a length (width) L4 of its shorter edge in a range of 250 to 320 mm.

Further, a solar cell module may generally have a length of its shorter edge in a range of 240 to 480 mm in view of a size of a common flat roof tile. However, in this embodiment, the module 10 has a length L2 of its shorter edge in a range of 280 to 360 mm in view of improvement of incident photon-to-current conversion efficiency by minimizing a part hidden behind depending on an insolation condition with an effective width no less than the common flat roof-tile.

The panel 12 is an integrated solar cell formed in a substantially rectangular plane as shown in FIGS. 1A and 2. The panel 12 can employ one formed by laminating a film such as a conducting film and a semiconductor film on a glass substrate, for example, cutting a plurality of grooves on the laminated layer so as to form a predetermined number of one-cell batteries (unit solar cells), and electrically connecting the unit solar cells in series. The panel 12 in this embodiment generates a voltage of about 100 volts by one panel.

The solar cell module 10 is arranged with its longer edges extending in a ridge direction (direction parallel to the ridge) of a house and its shorter edges extending in a direction perpendicular to the ridge of the house.

That is, the module 10 is arranged so that the longer edges are parallel to eaves and a ridge of a house. When a house has an inclined roof, for example, the two longer edges are arranged one above the other and parallel to a horizon and the two shorter edges are arranged right and left and slanted along the inclination of the roof.

As shown in FIG. 2, the terminal box 14 is secured to the back of the panel 12 by means such as glue. The terminal box 14 is positioned at a substantial center part of the longer edges and a lower area of the panel 12. The terminal box 14 has inside a plus electrode-connecting terminal (not shown) connected to a positive electrode of the panel 12 and a minus electrode-connecting terminal (not shown) connected to a negative electrode of the panel 12. Within the terminal box 14, there are provided two positive conducting wires 24 (hereinafter also referred to as positive inner wires 24), which are black coated wires, connected to the plus electrode-connecting terminal, while two negative conducting wires 26 (hereinafter also referred to as negative inner wires 26), which are white coated wires, connected to the minus electrode-connecting terminal.

The first cable 16 is a two-core cable formed by bundling one wire 24 of the positive inner wires 24, 24 and one wire 26 of the negative inner wires 26, 26. The second cable 18 is a two-core cable formed by bundling the other wire 24 of the positive inner wires 24, 24 and the other wire 26 of the negative inner wires 26, 26.

As shown in FIGS. 1B and 1C, the first cable 16 and the second cable 18 are different in color, the first cable 16 having the positive inner wire 24 and the negative inner wire 26 put together in a white insulation tube 16a and the second cable 18 having the positive inner wire 24 and the negative inner wire 26 put together in a black insulation tube 18a.

Further, the first cable 16 and the second cable 18 are different in length, one being longer than the other. Specifically, the first cable 16 is shorter than the second cable 18. The first cable 16 has a total length of less than 50% of the length L1 of the longer edges of the rectangular panel 12, while the second cable 18 has a total length of 50% or more of the length L1.

Herein, a sum of the lengths of the first cable 16 and the second cable 18 is longer than the length L1.

More specifically, the second cable 18 is, as shown in FIG. 1A, pulled out from the longer edge (upper side edge) 150 of a ridge side of the module 10 toward the ridge side (upper side), having a length X of a part pulled out from the longer edge 150 to the connector 22 without a length of the connector 22, the length X being 50% or more of the length L1 of the panel 12 of the module 10.

The more recommended length X is 50% or more of the length L1 and simultaneously longer than the length L4 of the shorter edges of the panel 12 and shorter than the length L1.

Specifically, the length X of the second cable 18 is longer than (L1/2) and longer than L4 when the length of the longer edges of the panel 12 is designated as L1 and the length of the shorter edges of the panel 12 is designated as L4. The more recommended length X is longer than a sum of (L1/4) and L4 and shorter than a sum of ((L1/4)×3) and L4.

Further, the length X of the second cable 18 may be of a length obtained by the above-mentioned formulae using L2 instead of L4 in view of flexibility for connection. That is, the length X of the second cable 18 is longer than (L1/2) and longer than L2 when the length of the longer edges of the panel 12 is designated as L1 and the length of the shorter edges of the module 10 is designated as L2. The more recommended length X is longer than a sum of (L1/4) and L2 and shorter than a sum of ((L1/4×3) and L2.

Meanwhile, the first cable 16 has a length Y of a part pulled out from the longer edge 150 is shorter than the length X of the second cable 18 and shorter than (L1/2).

Further, the length Y is shorter than the length L4 of the shorter edges of the panel 12.

The length Y of the first cable 16 may be of a length obtained by the above-mentioned formulae using L2 instead of L4 in view of flexibility for connection. That is, the length Y of the first cable 16 is shorter than L2 of the shorter edges of the module 10.

As shown in FIGS. 1A to 1C, the first cable 16 and the second cable 18 have the first connector 20 and the second connector 22 respectively attached to the respective ends. The first connector 20 and the second connector 22 have the same configuration though being different in color. In this embodiment, the first connector 20 is white, while the second connector 22 is black.

Figure 3:
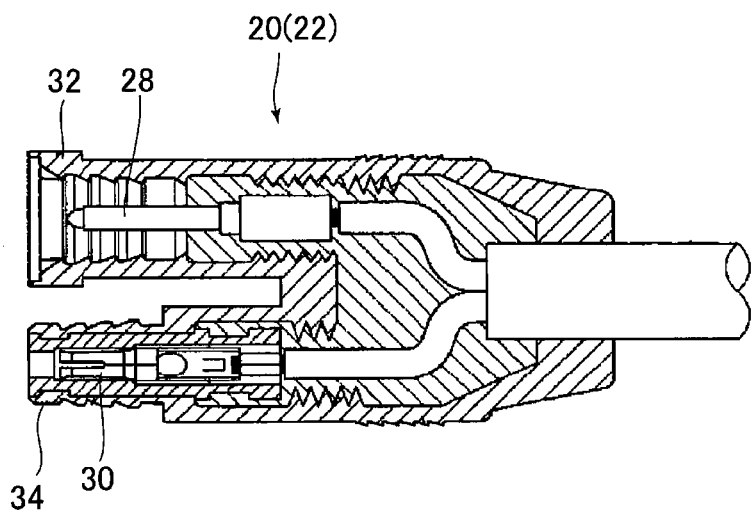
FIG. 3 is another cross-section of the connector of the module in FIG. 1.

As shown in FIGS. 1B, 1C and 3, the first connector 20 and the second connector 22 each are provided with a pin terminal 28 and a socket terminal 30. The first and the second connectors 20 and 22 each are provided with a female portion 32 and a male portion 34 with the pin terminal 28 being within the female portion 32 and the socket terminal 30 being within the male portion 34.

As shown in FIGS. 1B and 1C, in this embodiment, the positive inner wire 24 is connected to the pin terminal 28 of the first connector 20, while the negative inner wire 26 is connected to the socket terminal 30 of the first connector 20. In contrast, the negative inner wire 26 is connected to the pin terminal 28 of the second connector 22, while the positive inner wire 24 is connected to the socket terminal 30 of the second connector 22. That is, in the first connector 20, the pin terminal 28 is a positive electrode and the socket terminal 30 is a negative electrode. In contrast, in the second connector 22, the pin terminal 28 is a negative electrode and the socket terminal 30 is a positive electrode. Therefore, in the first connector 20 and the second connector 22, the female portion 32 of one of the connectors 20, 22 is engaged with the male portion 34 of the other of the connectors 20, 22 and whereby the pin terminal 28 of the one of the connectors 20 and 22 is connected to the socket terminal 30 of the other of the connectors 20 and 22, so that electrodes having the same polarity are electrically connected.

As shown in FIG. 14, the base member 70 is made of a plate of a substantially rectangular shape, which is formed into a predetermined shape by bending a piece of metal plate or a plurality of metal plates. Production of the base member 70 by a piece of metal plate is easily worked, reduces production costs, and further allows a configuration without a connected portion, thereby adding the advantage of strength. Thus, the base member 70 is preferably made by bending a piece of metal plate in view of those advantages.

On the base member 70 produced as described above, a cover attaching portion 72, a solar-cell arranging portion 74, a ridge-side fixing portion 76, and an overlapping portion 78 are formed in this order from the eaves side, the ridge-side fixing portion 76 being for fixing a ridge side of the solar cell panel 12 arranged on the solar-cell arranging portion 74 and the overlapping portion 78 being for being overlapped with an eave-side end portion of the solar cell module 10 or of a common roof tile adjacently arranged on the ridge side (upper row). The base member 70 has the trough-like gutter 80 formed at its side. The base member 70 is preferably made of a metal plate such as a steel plate, an aluminum plate, and a stainless steel plate, and in this embodiment, a Galvalume steel plate is used.

Figure 15:
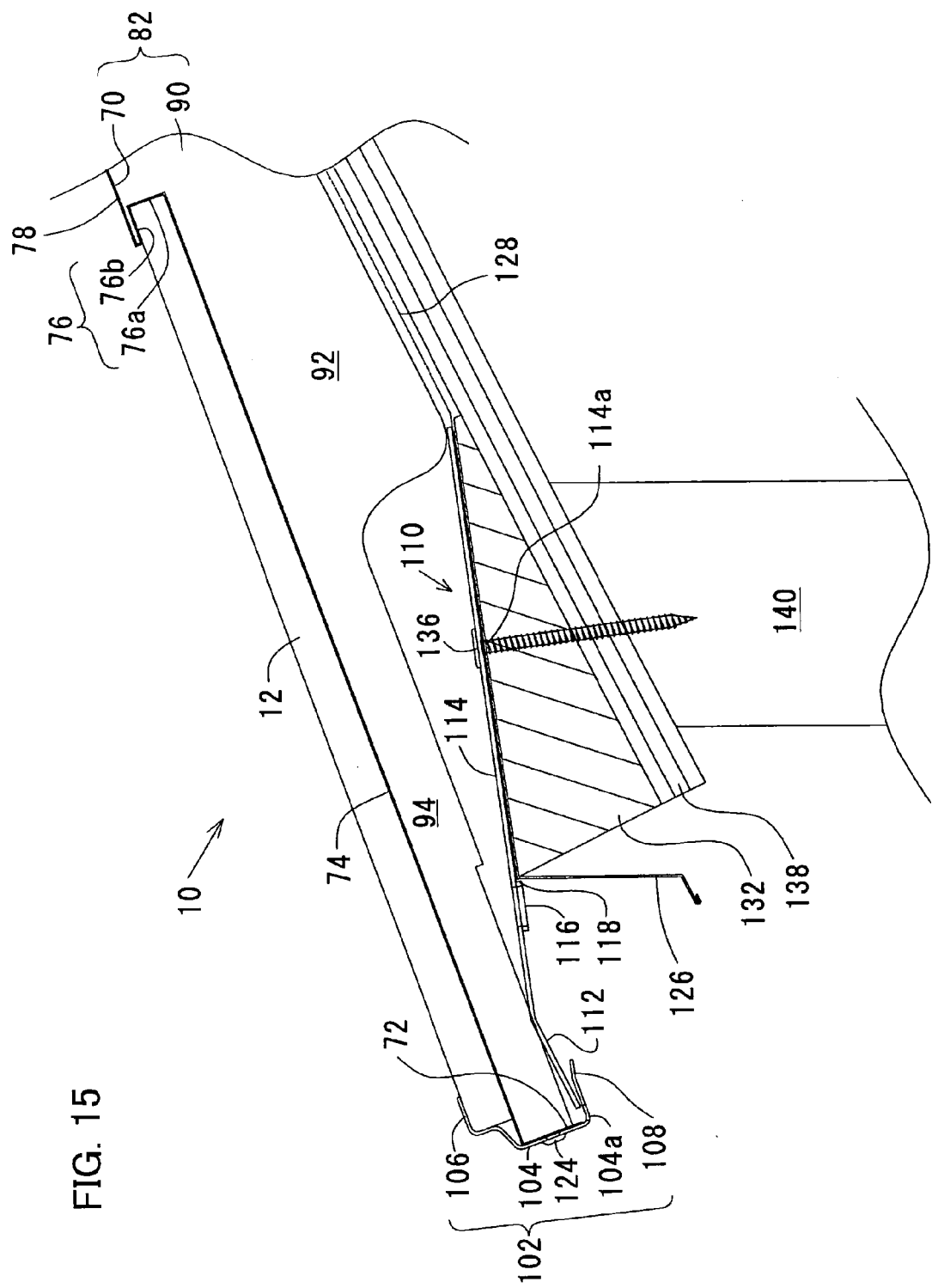
FIG. 15 is a cross section showing the solar cell module in FIG. 1 arranged adjacent to the eaves on a top face of a house.

As shown in FIG. 15, the cover attaching portion 72, which is formed by an eave-side end of the base member 70 bent to the back at a substantially right angle, is a portion to which the front cover 102 described below is attached.

The solar-cell arranging portion 74, which is formed in the substantially same size as the panel 12, is a planate portion on which the solar cell panel 12 is arranged. As shown in FIG. 14, the solar-cell arranging portion 74 has an opening 74a in which the terminal box 14 of the panel 12 is inserted at its substantial center part. In the solar cell module 10 in this embodiment, the solar cell panel 12 is mounted on the base member 70 from its front face, so that the terminal box 14, the cables 16, 18, and the connectors 20, 22 come to the back of the base member 70 through the opening 74a, as shown in FIG. 2.

As shown in FIG. 15, the ridge-side fixing portion 76 is a portion for fixing the ridge side of the solar cell panel 12 arranged on the solar cell arranging portion 74. The fixing portion 76 has a rising portion 76a and a surface holding portion 76b, the rising portion 76a being formed by bending the base member 70 to the front face at a substantially right angle at a predetermined position and the surface holding portion 76b being formed by bending the base member 70 to the eaves side at a predetermined position from a proximal end of the rising portion 76a. The rising portion 76a has a contact with a ridge-side end face of the panel 12 and the holding portion 76b covers a part of a surface (light-receiving face) of the panel 12 and puts a pressing force from the surface side.

The overlapping portion 78 is a planate portion formed by bending the base member 70 to the ridge side at a predetermined position from a proximal end of the holding portion 76b of the fixing portion 76. As shown in FIG. 14, the overlapping portion 78 has throughholes 78a at predetermined positions and throughholes 78b at predetermined positions nearer to the ridge side than the throughholes 78a, the throughholes 78a being for securing the hooking brackets 84 described below and the throughholes 78b being for driving in screws therethrough to fix the module 10 to a house.

The overlapping portion 78 is located at an area except an upper face of the solar cell panel 12.

Next, the reinforcing heat insulator 90 will be described, making reference to FIG. 2. The reinforcing heat insulator 90 is a member made of foamed resin attached to the back of the base member 70 for keeping strength and heat insulation of the solar cell module 10. The heat insulator 90 has a ridge-direction reinforcing portion 92 extending in a ridge direction along the ridge-side longer edge of the base member 70 and an inclining-direction reinforcing portion 94 extending in a direction toward eaves (perpendicular to the ridge) along the shorter edges of the base member 70 from the both ends of the ridge-direction reinforcing portion 92. The inclining-direction reinforcing portion 94 is a portion to be overlapped on the overlapping portion 78 of the solar cell module 10 or on a common roof tile adjacently arranged on the eaves side (lower row) and is formed to have a thickness thinner than the ridge-direction reinforcing portion 92.

The heat insulator 90 is arranged along a peripheral part of the base member 70 instead of being arranged on the entire back of the base member 70. Thus, the base member 70 has at its back an accommodation space (gap portion) 96 surrounded by the heat insulator 90 and opening at the eaves side. The terminal box 14 is housed at a substantial center part of the space 96. Further, the wired cables 16, 18 are accommodated in the space 96.

In this embodiment, the cables 16, 18 are pulled out from the longer edge 150 of the ridge side of the solar cell module 10, so that the solar cell modules 10 are connected in parallel by connecting the connectors 20, 22 of the cables 16, 18 of the modules 10 adjacently located on the right and left hands in the same row as described below. The cables 16, 18 are pulled out from the longer edge 150 of the module 10 as described above, so that the connectors 20, 22 are connected above and outside the modules 10. When the modules in an upper row are arranged as described below, the wired cables 16, 18 (including the connectors 20, 22) are housed in the space 96 of the modules in the upper row.

Further, there is a gap between the inclining-direction reinforcing portion 94 and a house, through which gap the cables 16, 18 are inserted.

The ridge-direction reinforcing portion 92 of the heat insulator 90 has three cable grooves 98, as shown in FIG. 2, at a face opposite to the face with which the base member 70 contacts. The cable grooves 98 communicate from the ridge side to the eaves side, so as to connect inside and outside of the space 96. The cable grooves 98 consist of a center groove 98a located at a substantial center part of the reinforcing portion 92 and side grooves 98b, 98b located at right and left of the center groove 98a at predetermined intervals from the center groove 98a. In the solar cell module 10, the center groove 98a and the terminal box 14 are located on the substantially same line, so that the cables 16, 18 pulled out from the terminal box 14 are pulled from the space 96 through the center groove 98a to an outside of the ridge side. The side grooves 98b, 98b are used for wiring with the other solar cell modules 10 arranged in the upper row and the lower row.

Figure 4:
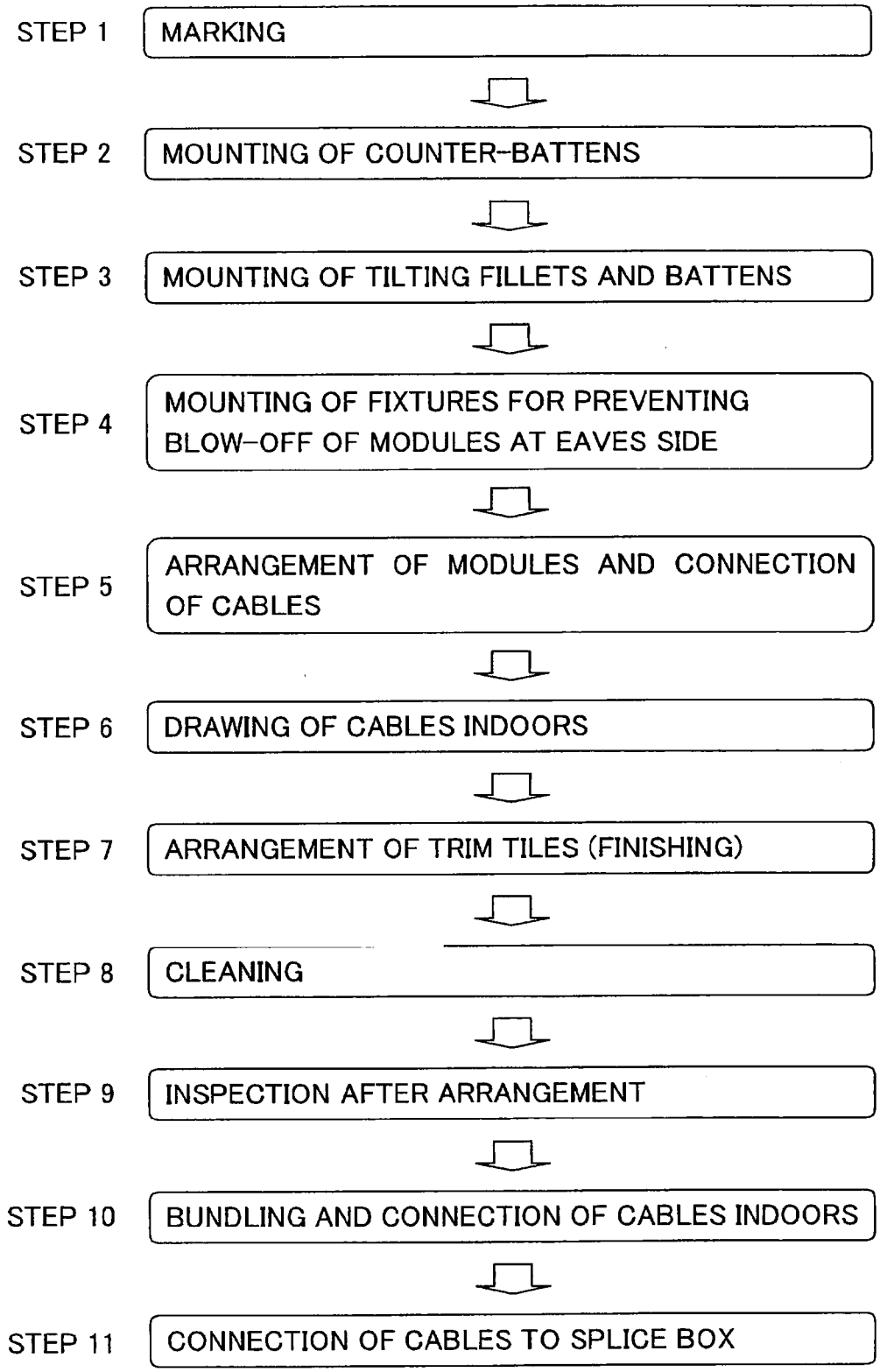
FIG. 4 is a flow chart showing a work procedure of arrangement of the solar cell modules.

Now, a work procedure for arranging the above-mentioned solar cell modules 10 on the roof R of the house and an arrangement structure 100 of the solar cell modules 10 will be described below. FIG. 4 is a flow chart showing the work procedure of arrangement of the solar cell modules 10 on the roof R of the house.

For arrangement of the solar cell modules 10, a drip at the eaves and a predetermined roofing member are firstly attached to the roof R of the house on which the modules 10 are arranged. At the step 1, markings indicating lines, shapes, and sizes on the roof R required to proceed with the work are carried out.

At the next step 2, counter-battens are mounted at predetermined intervals. At the step 3, tilting fillets (eaves boards) and battens (gauge laths) are mounted. The battens are mounted at predetermined intervals toward the ridge. At the step 4, fixtures for preventing blow-off of the solar cell modules 10 are mounted on predetermined positions, and then the procedure proceeds to the step 5.

Figure 5A:
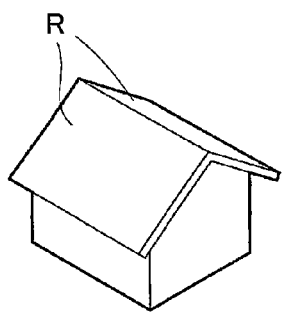
FIG. 5A is a view illustrating a roof of a house and FIG. 5B is a view illustrating the roof of the house arranged with the solar cell modules.
Figure 5B:
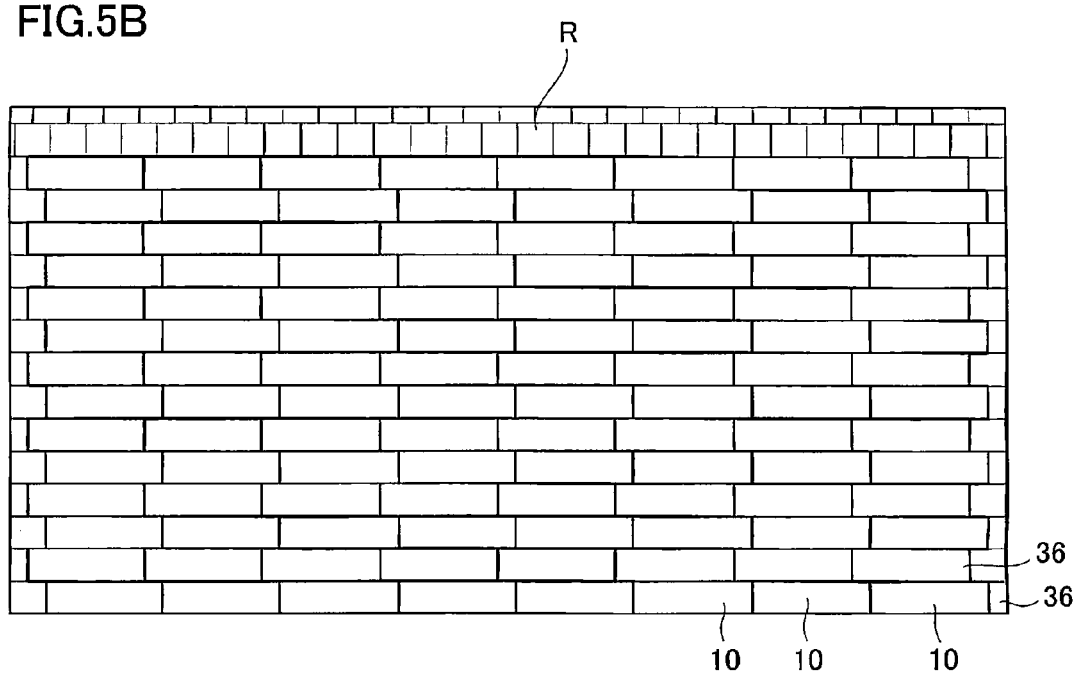

At the step 5, the solar cell modules 10 are sequentially arranged from the eaves side to the ridge side of the roof R with the adjacent solar cell modules 10, 10 connected by the cables 16, 18. More specifically, the modules 10 are arranged, as shown in FIGS. 5A and 5B, in such a manner that the shorter edges of a plurality of modules 10 are put together side by side with each other so as to form a module row 36 arranged in a row and that the modules 10 are fixed to the roof R by means such as screws. In this embodiment, even number of the module rows 36 (fourteen rows 36 in FIG. 5B) are arranged on the roof R.

Figure 16A:
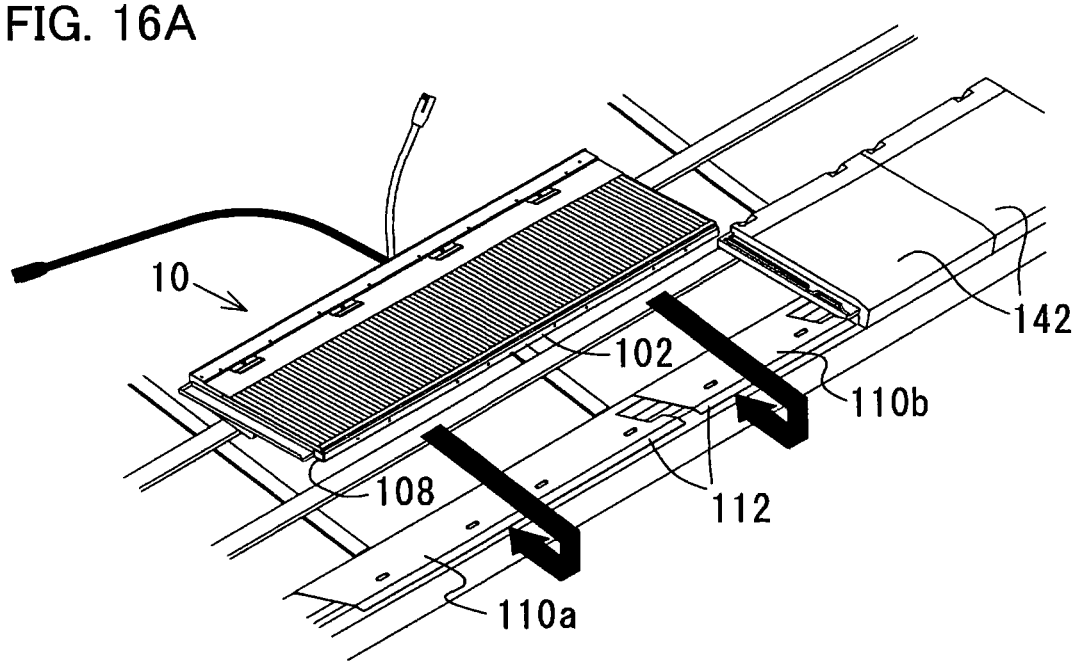
FIGS. 16A and 16B each are a perspective view illustrating arrangement of the solar cell module adjacent to the eaves of a house having a roof structure in the present embodiment.
Figure 16B:
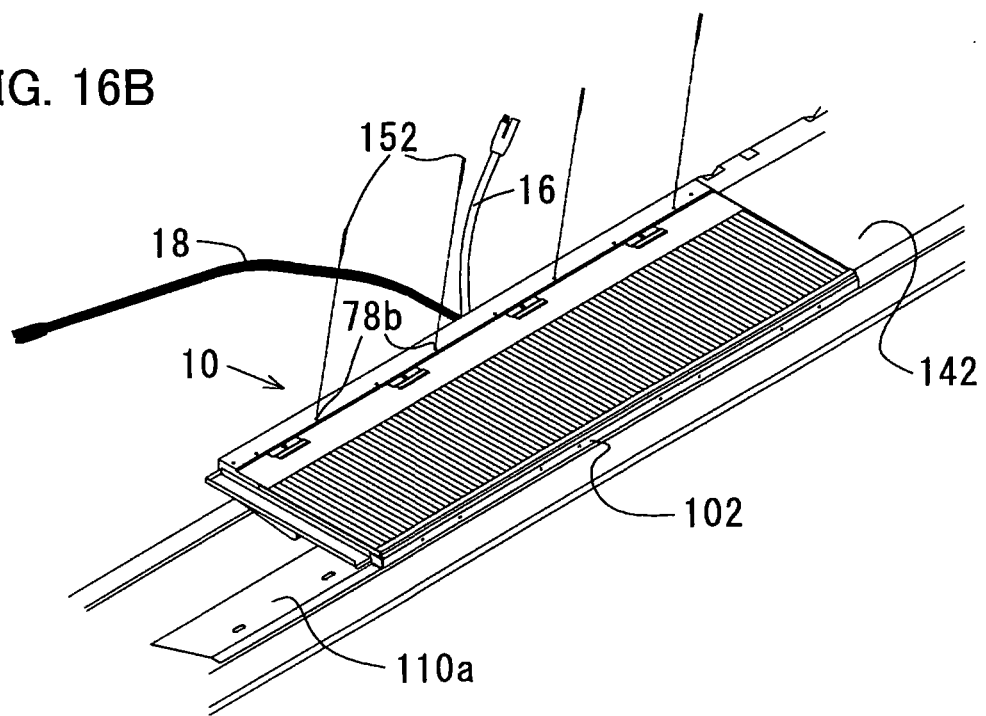

Specifically, after engagement of the modules 10 with the fixtures 110 for preventing blow-off of the modules 10, the modules 10, as shown in FIG. 16B, are fixed to the house by driving construction screws 152 into the throughholes 78b of the overlapping portion 78. At this time, the cables 16, 18 of the modules 10 are pulled out toward the ridge side.

Figure 8:
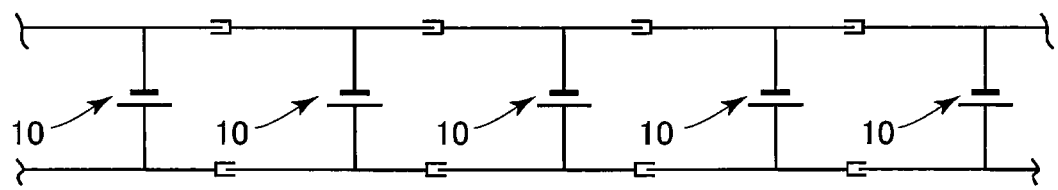
FIG. 8 is a circuit diagram of wiring in which the solar cell modules are properly connected.

As shown in FIG. 6, during formation of the module row 36, the first connector 20 of one of the adjacent modules 10, 10 is connected to the second connector 22 of the other of the adjacent modules 10, 10, and whereby the adjacent modules 10, 10 are electrically connected in parallel. Specifically, connection of the first connector 20 in white attached to the first cable 16 in white to the second connector 22 in black attached to the cable 18 in black allows parallel connection of the adjacent modules 10, 10. Therefore, in the modules 10 in this embodiment, connection of the adjacent modules 10, 10 on the right and left hands by the cables 16, 18 enables sequential parallel connection of all the modules 10 belonging to the module row 36 (FIG. 8).

Herein, in the module 10 in this embodiment, the first cable 16 is shorter than the second cable 18 as described above. Therefore, according to the module 10, workers immediately determine whether the connector attached to the cable 16, 18 is the first connector 20 or the second connector 22 by confirming a length of said cable.

Figure 7:
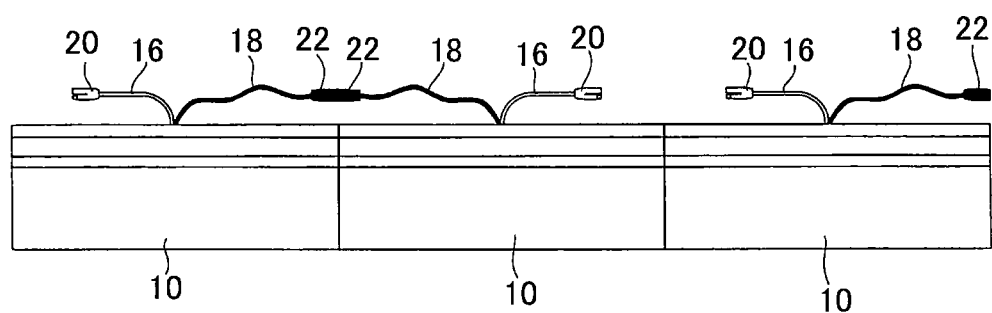
FIG. 7 is a conceptual diagram showing a module row in which the solar cell modules are improperly connected.

In the module 10 in this embodiment, the first cable 16 has the total length of less than 50% of the length of the longer edges of the rectangular panel 12, while the second cable 18 has the total length of 50% or more of the length of the longer edges of the panel 12. Therefore, as shown in FIG. 7, the first connectors 20, 20 of the respective first cables 16, 16 of the adjacent modules 10, 10 with their shorter edges adjacently put together are unconnectable to each other. Consequently, the solar cell module 10 of this embodiment surely prevents improper connection of the first connectors 20, 20 of the adjacent modules 10, 10.

In the module 10, the second cable 18 is longer and has higher flexibility of wiring than the first cable 16. Thus, the second cable 18 having high flexibility is bent halfway toward the first cable 16, so that the cables 16, 18 are electrically connected via the first connector 20 and the second connector 22. Consequently, a part such as a connected part of the first connector 20 and the first cable 16, a connected part of the second connector 22 and the second cable 18, and a connected part of the terminal box 14 and the first and the second cables 16, 18 is subjected to less stress caused by bending. That reduces the possibility of a problem such as breaking of wire and avoids the need to provide the first and the second cables 16, 18 too much long. Further, the module 10 is excellent in workability and dispenses with a space for accommodating the first cable 16 and the second cable 18 because of no need to provide the cables 16, 18 too much long.

In the above-mentioned solar cell module 10, the first cable 16 and the second cable 18 each are a two-core cable, thus having high rigidity. Further, the modules 10 are electrically connected by only connection of the two cables 16, 18, thereby minimizing the number of cables. Still further, the module 10 has a simple wiring, so as to reduce the possibility of a problem such as breaking of the cables 16, 18 when being arranged.

The module 10 in this embodiment makes the first cable 16 white and the second cable 18 black. Therefore, workers easily determine the kinds of the connectors 20, 22 attached to the cables 16, 18 by confirming colors of the cables 16, 18.

The module 10 makes the first connector 20 white and the second connector 22 black. That is, the first connector 20 and the second connector 22 are different in color from each other. Therefore, in the module 10 in this embodiment, workers rapidly determine the kinds of the connectors 20, 22 by confirming colors of the connectors 20 and 22. Consequently, the solar cell module 10 in this embodiment allows workers rapid and appropriate selection of a connector and reduces improper wiring, thereby giving high working efficiency.

Figure 19:
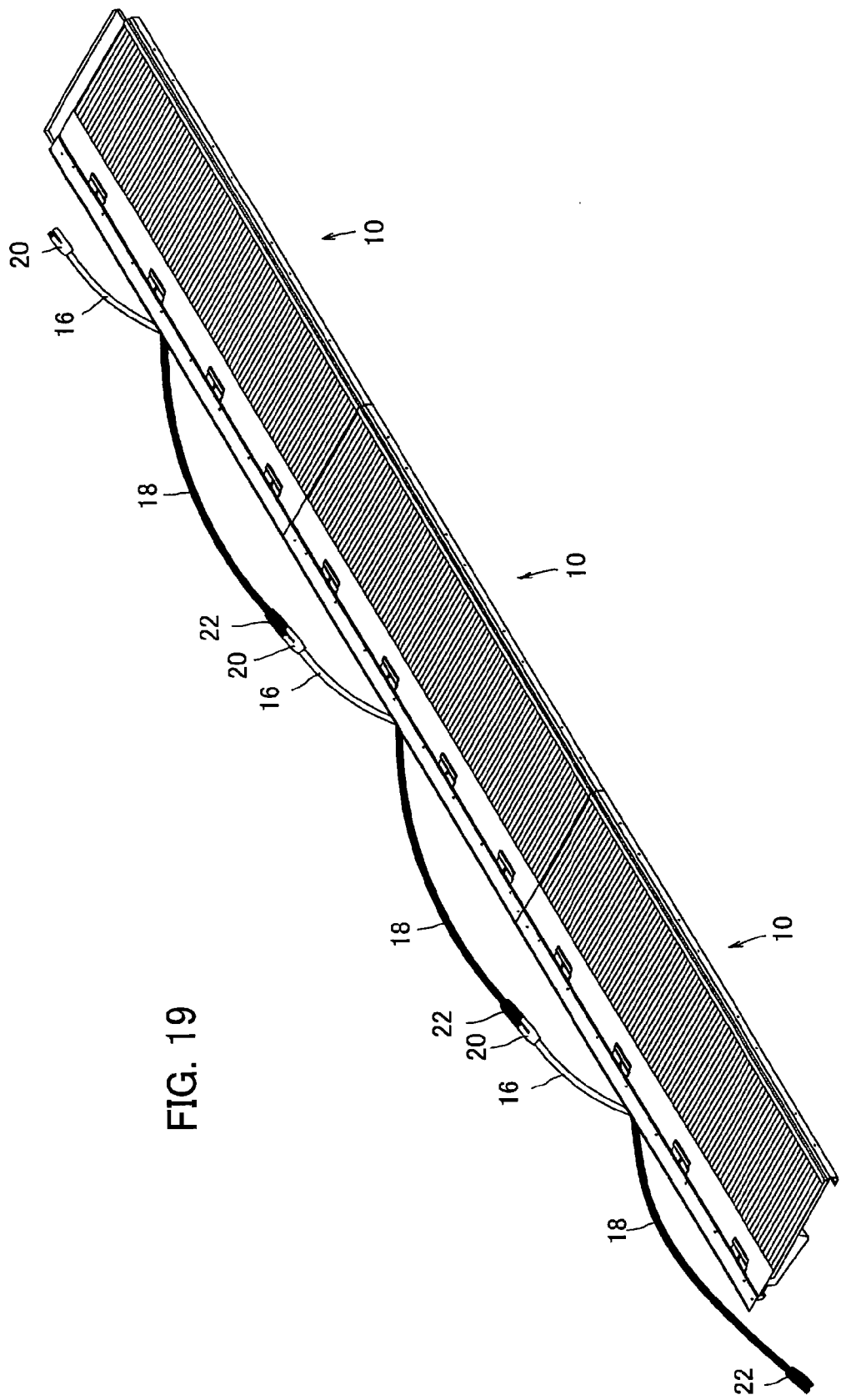
FIG. 19 is a perspective view illustrating a cable wiring of the solar cell modules in the roof structure in the present embodiment.

Further, in the module 10, the first cable 16 and the second cable 18 each are pulled out from a center part of the ridge side of the module 10 as shown in FIG. 1A, so as to be connected to each other with the module 10 fixed to the roof. That is, even when the module 10 is fixed to the roof by means such as nails, the first cable 16 and the second cable 18 are, as shown in FIGS. 16A, 16B and 19, located outside of the main body of the module 10. Consequently, in this embodiment, the connection of the cables 16, 18 can be carried out after fixation of the module 10 to the roof by means such as nails.

The connection of the cables 16, 18 is carried out one row by one row. In this embodiment, the modules 10 are arranged from the eaves side and thus, all the modules 10 belonging to one row (first row) are firstly arranged at the eaves or near the eaves. Then, the cables 16, 18 pulled out toward the ridge side of the modules 10 are sequentially connected. That reduces the possibility of improper wiring and improper connection compared with the way to connect the cables every one module. The connection in one row is carried out adjacent to an upper row of the modules 10 having been arranged in the row in question. The connected cables 16, 18 are placed, as shown in FIG. 19, adjacent to the upper row of the modules 10 having been arranged in the row in question.

Figure 20:
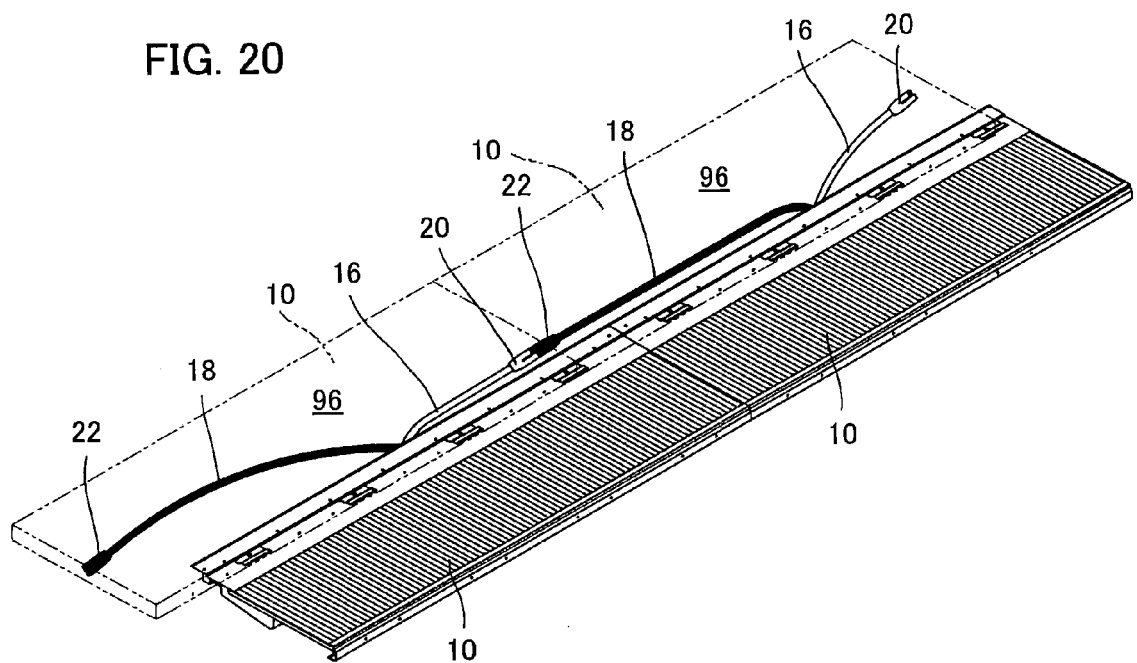
FIG. 20 is a perspective view illustrating a relationship between a cable connection of the solar cell modules belonging to a specific module row in the roof structure in the present embodiment and the solar cell modules belonging to an adjacent module row.

Subsequently, the modules 10 in the second row are fixed. Herein, the modules 10 in the second row are arranged so that the eaves sides of the modules 10 are placed on the overlapping portions 78 of the modules 10 in the first row. Therefore, the modules 10 in the second row overlap, as shown in FIG. 20, on the cables 16, 18 of the modules 10 in the first row, the cables 16, 18 in the first row being housed in the spaces 96 of the modules 10 in the second row.

Figure 17:
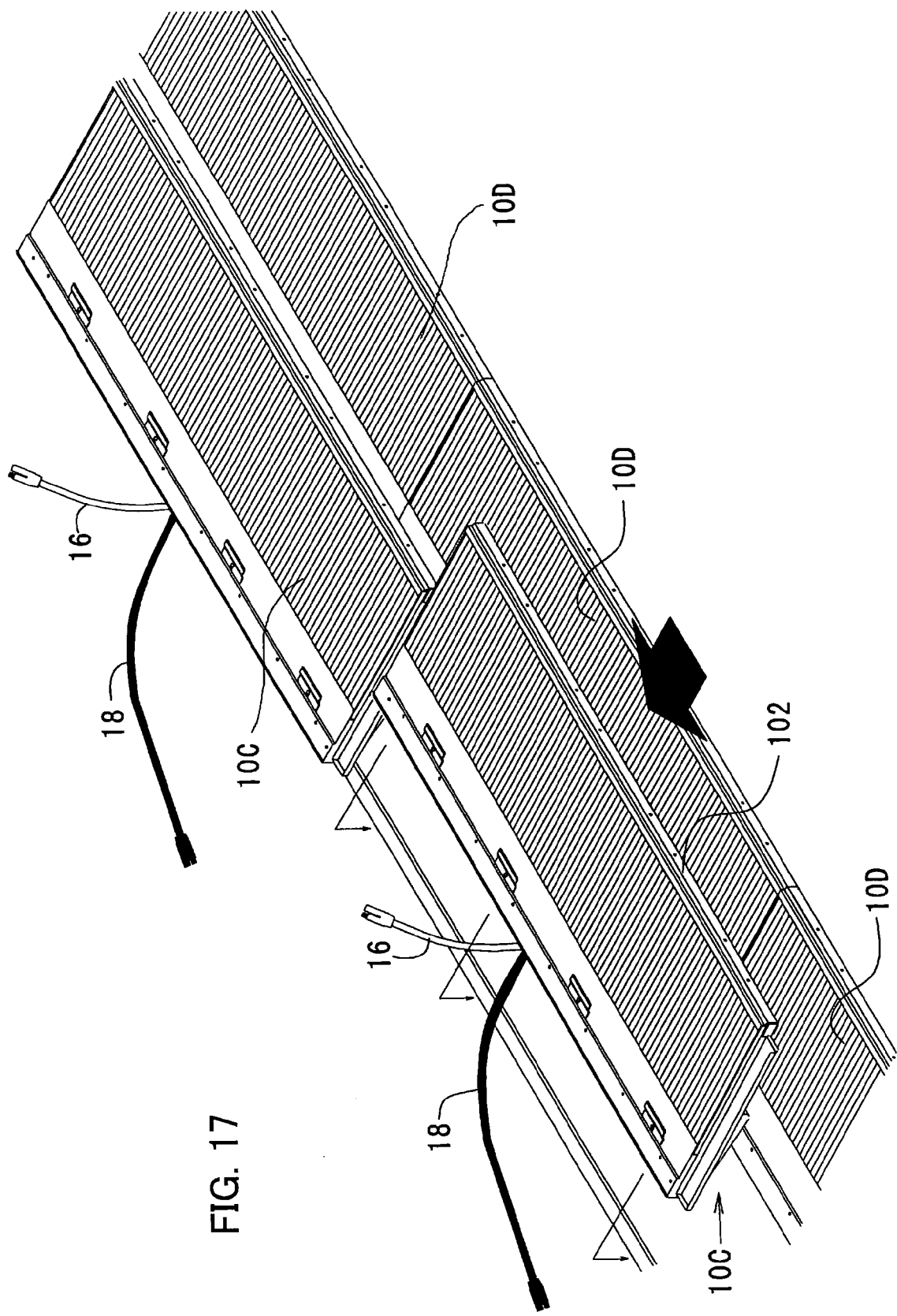
FIG. 17 is a perspective view illustrating arrangement of the solar cell modules after the first module row in the roof structure in the present embodiment.
Figure 18:
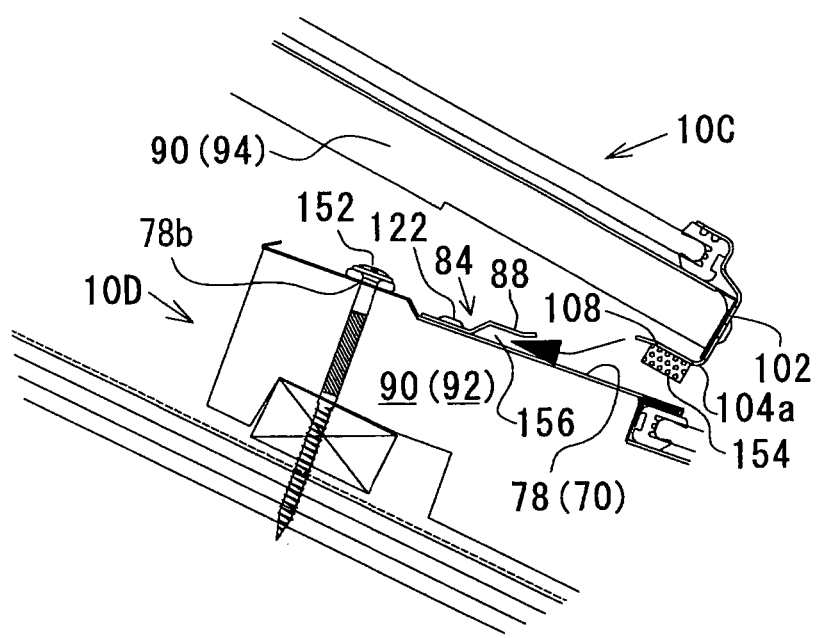
FIG. 18 is a partial cross-section illustrating arrangement of the solar cell module after the first module row in the roof structure in the present invention.

The modules 10 in the module rows 36 that follow the first row are arranged in the following way as shown in FIGS. 17 and 18. The front covers 102 of the modules 10C to be arranged in an upper row are arranged on the eaves side with stoppers 108 of the covers 102 inserted into gaps 156 between the engaging portion 88 of the hooking brackets 84 and the surface of the overlapping portions 78 of the bases 70 of the modules 10D having been arranged in the lower row. The modules 10C are pulled up overall toward the ridge side, so as to be engaged with the modules 10D. Herein, the stopper 108 of the module 10C is provided with a seal 154, which is arranged without space in the gap 156 when the stopper 108 is inserted into the gap 156 between the engaging portion 88 of the hooking bracket 84 and the base member 70. That avoids slip at an engaged portion of the module 10C and the module 10D.

When the modules 10C are arranged at predetermined positions by engagement of the modules 10C with the modules 10D, the cables 16, 18 of the modules 10D in the lower row are orderly housed in the spaces 96 in the modules 10C in the upper row.

After engagement of the stoppers 108 of the modules 10C in the upper row with the hooking brackets 84 of the modules 10D in the lower row respectively, the modules 10C in the upper row are fixed to the house by driving the screws 152 in the throughholes 78b of the overlapping portion 78 with the cables 16, 18 pulled out to the ridge side. Also as for the module rows 36 that follow the first row arranged in this way, all the modules 10 belonging to the module row 36 are connected in parallel by connecting the adjacent modules 10, 10 on the right and left hands by the cables 16, 18 in the same procedure as in the module row 36 in the first row.

Figure 9:
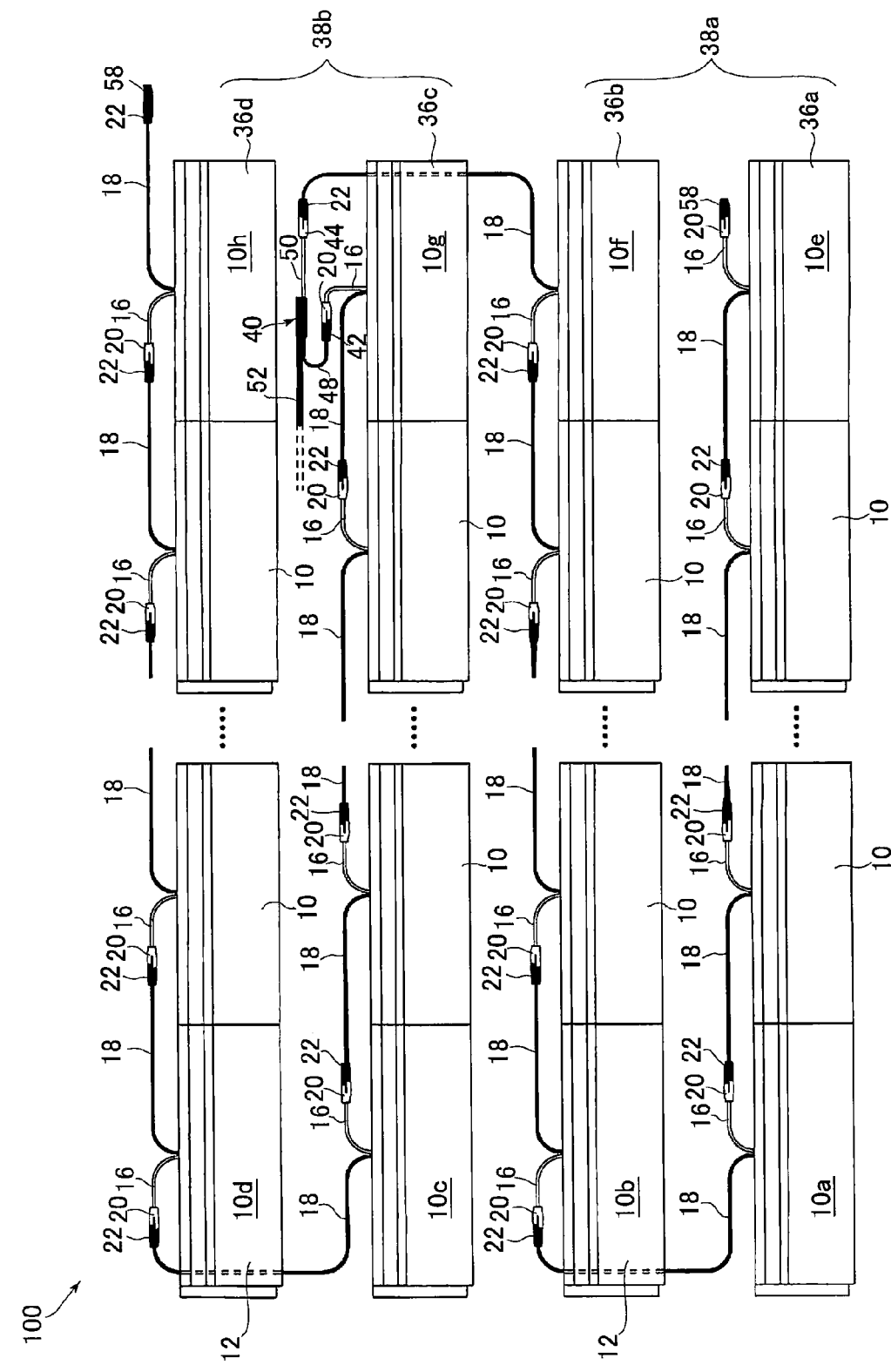
FIG. 9 is a conceptual diagram showing an arrangement structure of the solar cell modules.

As shown in FIG. 9, the solar cell module 10 in this embodiment has the arrangement structure 100 in which connection orders of the cables 16, 18 of the module rows 36a, 36c in the odd-numbered rows from the eaves side (from the bottom) and those of the module rows 36b, 36d in the even-numbered rows therefrom are different in direction. Specifically, in the module rows 36a, 36c in the odd-numbered rows, the second connector 22 in the right module 10 and the first connector 20 in the left module 10 are connected, so as to connect the second cable 18 and the first cable 16. In contrast, in the module rows 36b, 36d in the even-numbered rows, the first connector 20 in the right module 10 and the second connector 22 in the left module 10 are connected, so as to connect the first cable 16 and the second cable 18.

When all the modules 10 constituting the module row 36 are connected by the cables 16, 18, as shown in FIG. 6, among the modules 10, 10 arranged at either side of a plurality of modules 10 constituting the module row 36, the first connector 20 of the module 10 situated at one end and the second connector 22 of the module 10 situated at the other end are unused (unconnected). These unused first and second connectors 20 and 22 are used for an electrical connection of the module rows 36, 36 arranged in an upper and lower rows.

In the arrangement structure 100 of the modules 10 shown in FIG. 9, for example, the module rows 36a, 36c in the odd-numbered rows and the module rows 36b, 36d in the even-numbered rows are connected respectively, so as to form solar cell blocks 38a, 38b. Specifically, the second cables 18 of the modules 10a, 10c arranged at the left ends of the module rows 36a, 36c in the odd-numbered rows pass through the respective backs of the solar cell panels 12 of the modules 10b, 10d arranged at the left ends of the module rows 36b, 36d in the even-numbered rows, so as to connect the second connectors 22 of the modules 10a, 10c to the respective first connectors 20 of the modules 10b, 10d.

Figure 21:
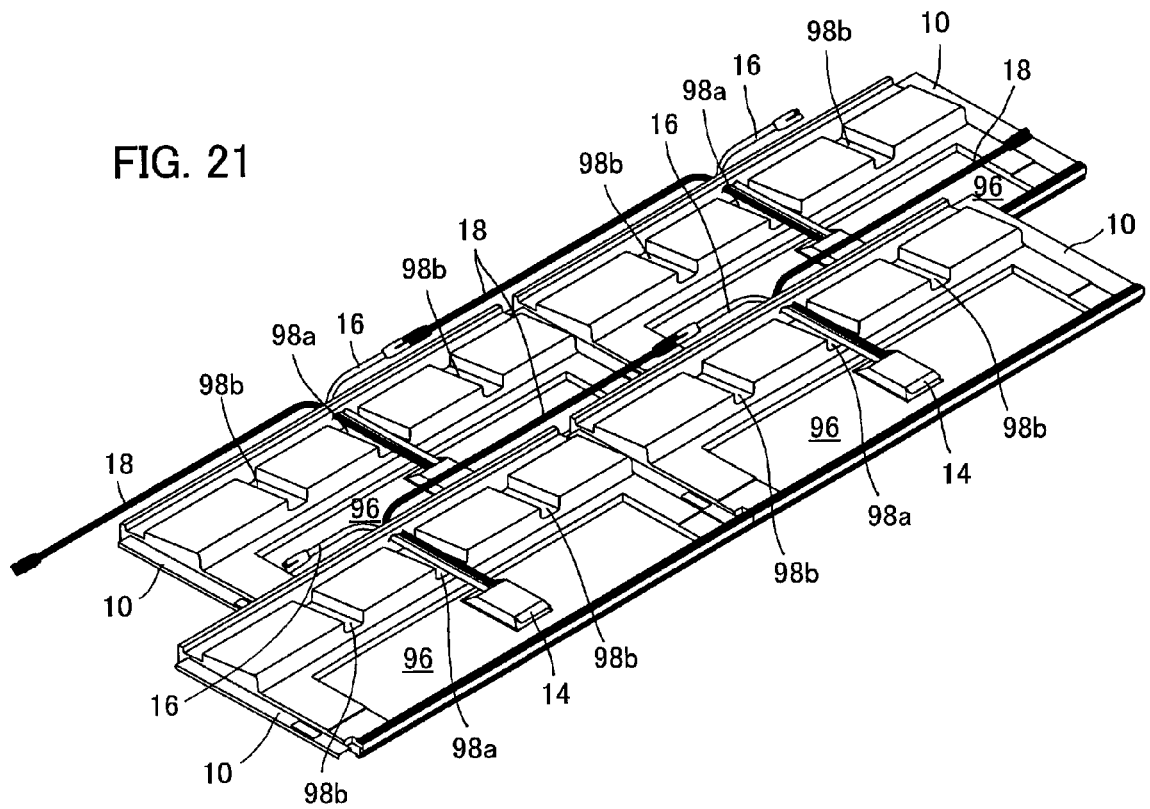
FIG. 21 is a perspective view showing a cable wiring of the solar cell modules in the roof structure in the present embodiment observed from a back of the modules.
Figure 22:
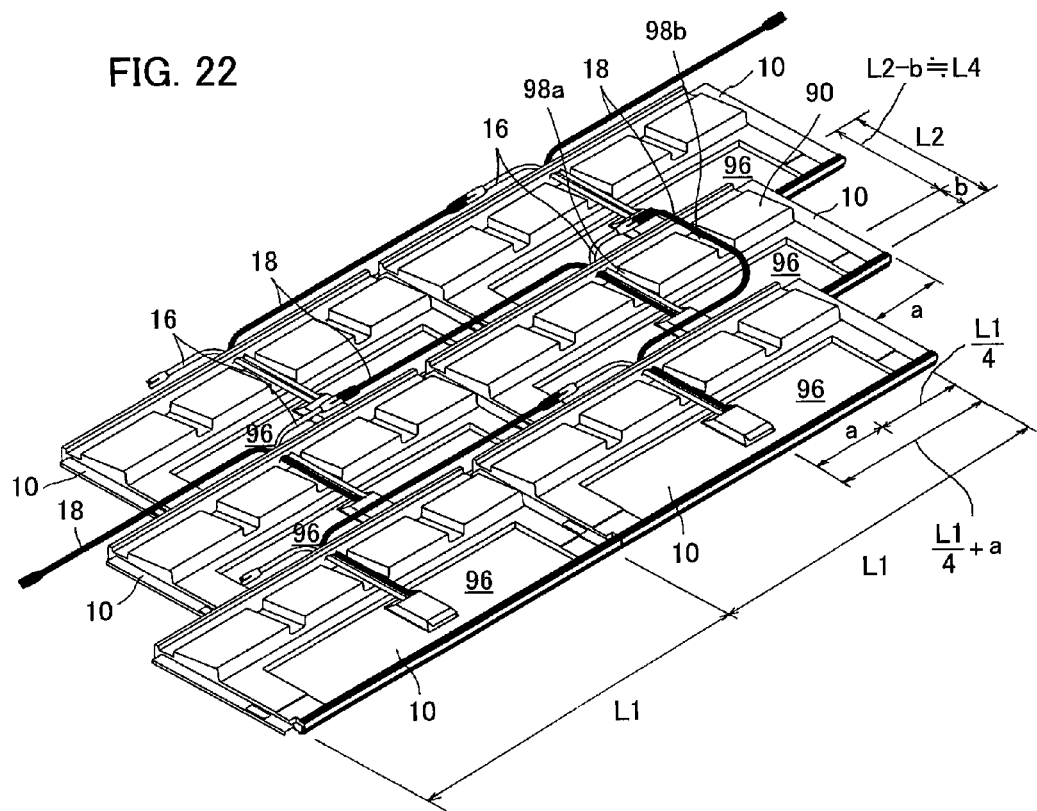
FIG. 22 is a perspective view showing the cable wiring of the solar cell modules at a portion adjacent to the end of the row in the roof structure in the present embodiment observed from the back of the modules.
Figure 23:
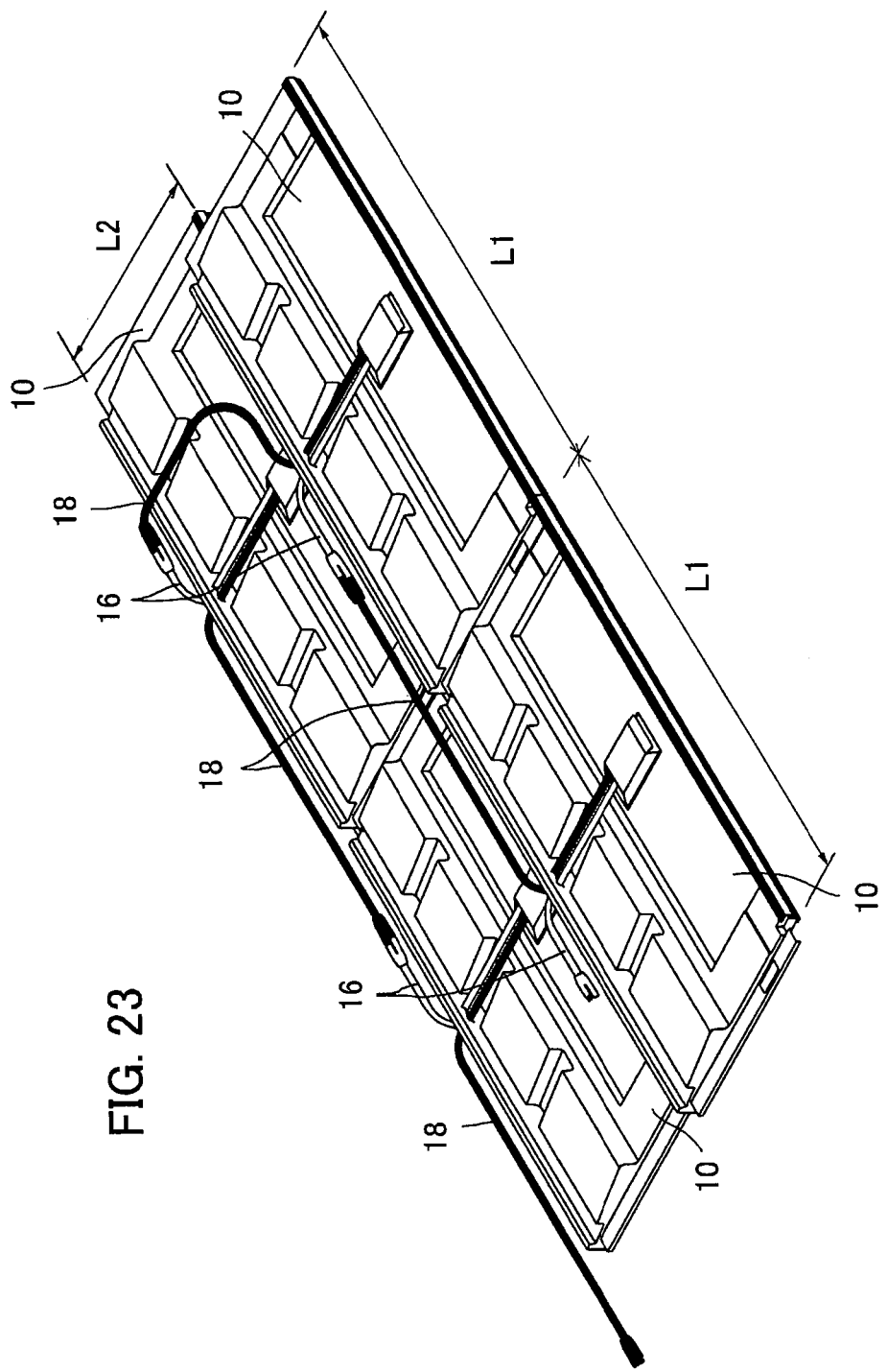
FIG. 23 is a view illustrating sizes of the modules and lengths of the cables when the modules are arranged on a roof with rows and columns justified.
Figure 24:
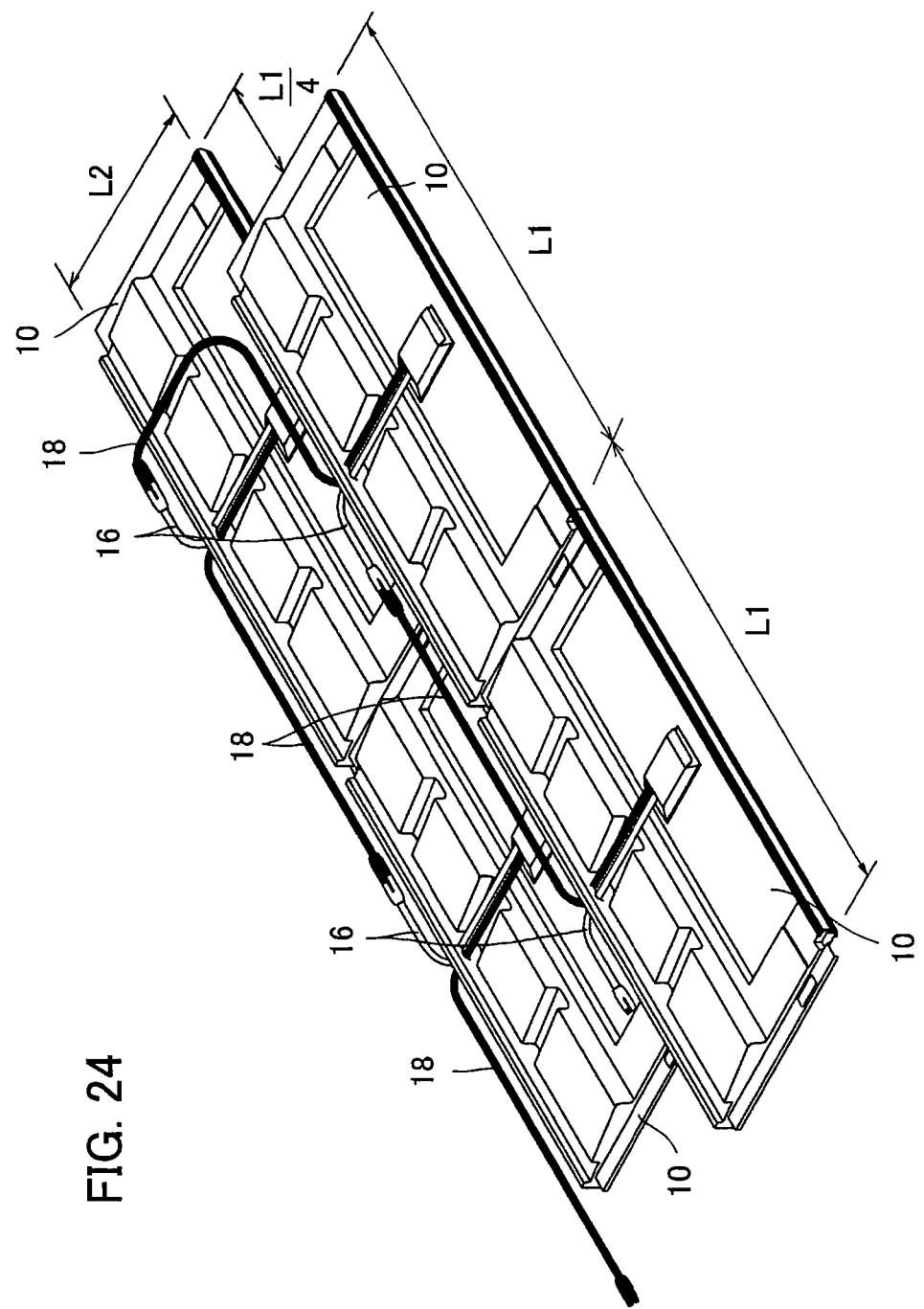
FIG. 24 is a view illustrating sizes of the modules and lengths of the cables when the modules are arranged on a roof with upper and lower rows shifted by a quarter of the length.
Figure 25:
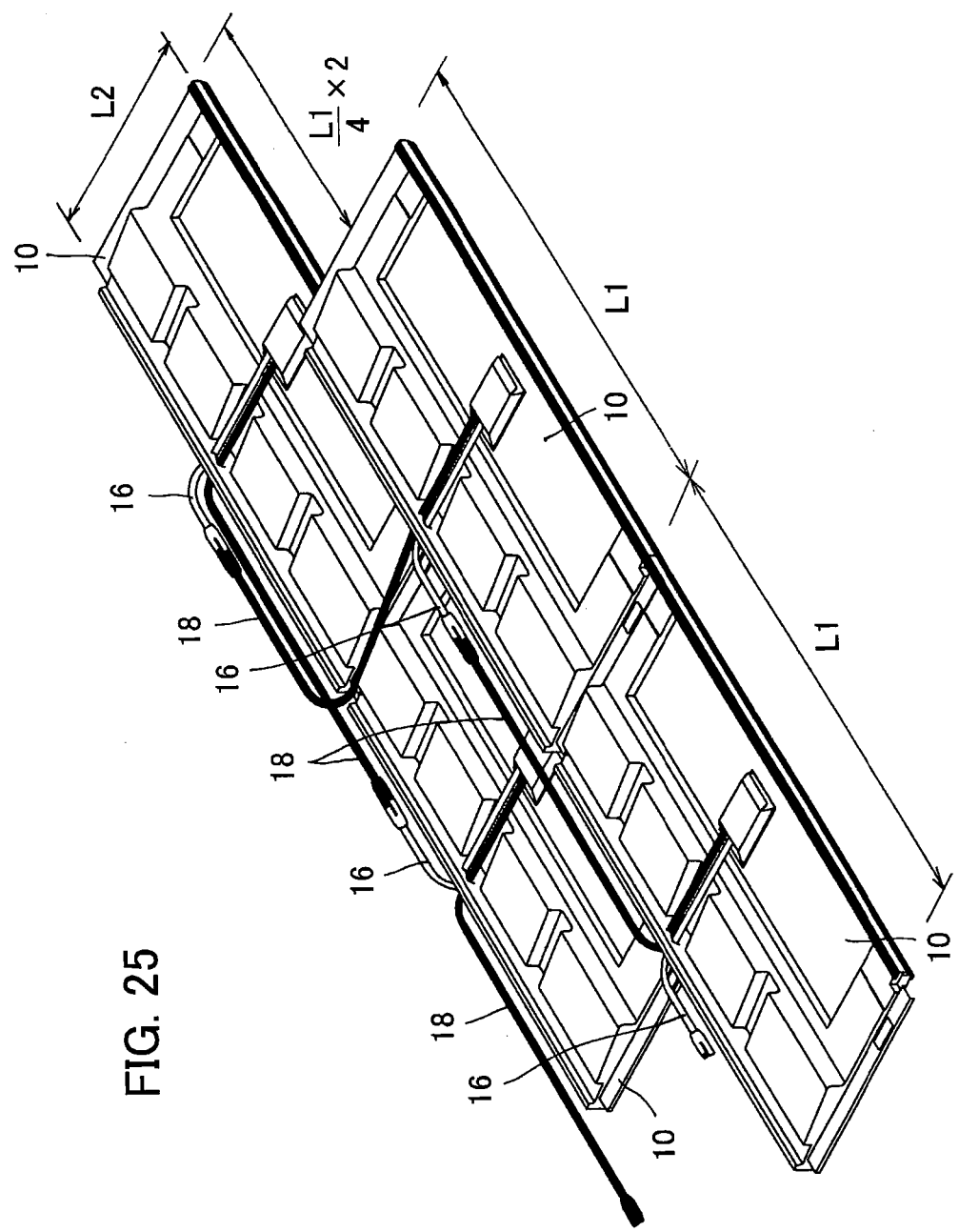
FIG. 25 is a view illustrating sizes of the modules and lengths of the cables when the modules are arranged on a roof with upper and lower rows shifted by a half of the length.
Figure 26:
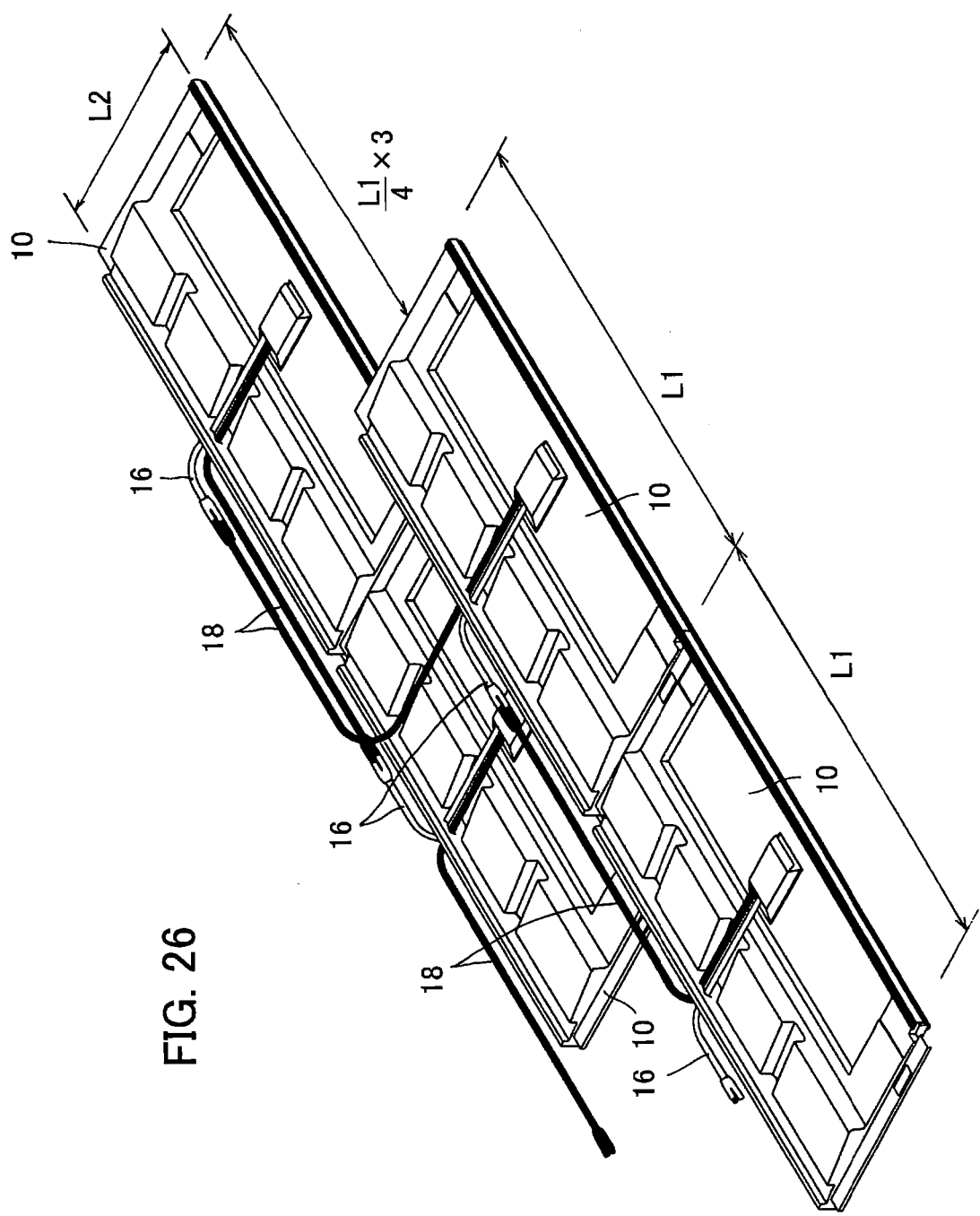
FIG. 26 is a view illustrating sizes of the modules and lengths of the cables when the modules are arranged on a roof with upper and lower rows shifted by a three quarters of the length.

As described above, in order to connect the second cables 18 of the modules 10a, 10c in the lower rows to the respective first cables 16 of the modules 10b, 10d in the upper rows, the second cables 18 in the lower rows pass through the respective backs of the panels 12. At this time, each of the second cables 18, as shown in FIGS. 21 and 22, passes through either of the side grooves 98b, 98b via the space 96 of the module 10b, 10d. Then, a distal end of the second cable 18 is pulled out further upwardly than the modules 10b, 10d in the upper row, so as to be connected to the first cable 16 of the module 10b, 10d in the upper row.

In this embodiment, in a case where the modules 10 constituting the solar cell block 38 are arranged in a plurality of rows, the longer cables (second cables 18) among the two cables 16, 18 connect the modules 10 in parallel.

Herein, in the module 10 in this embodiment, if the length X of the long cable (second cable 18) is longer than the length L4 of the shorter edges of the panel 12, the second cable 18 passes under and comes further above the module 10 belonging to the module row 36 in the upper row.

In view of margin for connection, if the length X of the long cable (second cable 18) is longer than the length L2 of the shorter edges of the module 10, the second cable 18 passes under and comes further above the module 10 belonging to the module row 36 in the upper row, so as to be easily connected to the other cable.

Practically, as shown in FIG. 22, the length X of the second cable 18 is necessarily to be made longer to some extent than the length L2 of the shorter edges of the module 10 because the space through which the cable 18 is inserted is confined and the modules 10 are arranged in a staggered manner. In the configuration shown in FIG. 22, the cable 18 passes under the module 10 via the side groove 98b in the heat insulator 90. The solar cell modules 10 belonging to the adjacent row are arranged with a shift by a length (a).

A portion overlapped with the overlapping portion 78 of the module 10 in the upper row has a length (b).

To describe by an example shown in FIG. 22, the second cable 18 has a length extended in a horizontal direction of ((L1/4)+(a)) and a length required in a vertical direction of (L2−(b)).

Therefore, the second cable 18 needs a length of ((L1/4)+(a))+(L2−(b))

In this embodiment, the length (L2−(b)) substantially equals to the length L4 of the shorter edges of the panel 12. Consequently, the second cable 18 needs a length (((L1/4)+(a))+L4).

FIGS. 23 to 26 each show an illustration of a considerable length of the cable 18 required by changing a shift length of the modules 10 belonging to adjacent rows. By these figures, the more the shift length (a) is, the longer the cable 18 is required. When the shift length becomes a three quarters of the total length L1 of the panel 12, the cable 18 is required to be longest, the length being a sum of ((L1/4).times.3) and L4. In consideration of the margin of connection, it is a sum of ((L1/4).times.3) and L2.

Consequently, the length of the cable 18 is less than or equal to a sum of ((L1/4).times.3) and L4 and preferably less than or equal to a sum of ((L1/4).times.3) and L2 in consideration of the margin.

The pulled-out length Y of the first cable 16 is shorter than the length X of the second cable 18 and shorter than a length (L1/2).

Further, the length Y is shorter than the length L4 of the shorter edges of the panel 12. Thus, the first cable 16 is prevented from passing under the module 10 in the upper row, so as to have no possibility of improper connection.

When the length Y is shorter than the length L2 of the shorter edges of the module 10, there is no possibility of improper connection because a margin for connection is practically needed.

The connection of the two cables 16, 18, in a case where the modules 10 constituting the solar cell block 38 are arranged in a plurality rows, is also carried out at outside of the modules 10. That achieves high workability. The connected cables 16, 18 are housed in the spaces 96 of the modules 10 in the next row but one as shown in FIG. 22.

Thereby, all the modules 10 belonging to the module rows 36a and 36b are connected in parallel, so as to form the solar cell block 38a. All the modules 10 belonging to the module rows 36c and 36d are also connected in parallel, so as to form the solar cell block 38b. The solar cell blocks 38a, 38b having been formed as described above are electrically connected in series by a service cable 40.

As shown in FIG. 10A, the service cable 40 consists mainly of a first serial connector 42 connected to the first connector 20 of the module 10, a second serial connector 44 connected to the second connector 22 of the module 10, an output connector 46 connected to an indoor power conditioner (not shown) so as to output electric power converted in the panel 12 of the module 10, a first outdoor cable 48 connected to the first serial connector 42, a second outdoor cable 50 connected to the second serial connector 44, an indoor cable 52 connected to the output connector 46, and a molded portion 54.

The first serial connector 42, the second serial connector 44, and the output connector 46 have the same configuration as the first connector 20 and the second connector 22 of the module 10. The first serial connector 42 and the output connector 46 are black, while the second serial connector 44 is white.

The first outdoor cable 48, the second outdoor cable 50, and the indoor cable 52 each have one positive inner wire 24 and one negative inner wire 26 in respective insulation tubes 48a, 50a, 52a as well as the first cable 16 and the second cable 18 of the module 10. The insulation tubes 48a, 52a of the first outdoor cable 48 and the indoor cable 52 are black, while the insulation tube 50a of the second outdoor cable 50 is white.

A white vinyl tape 56 is wound around a part adjacent to the output connector 46 of the indoor cable 52, thereby enabling immediate determination of the indoor cable 52 and the output connector 46.

As shown in FIG. 10B, the first outdoor cable 48, the second outdoor cable 50 and the indoor cable 52 are connected within the molded portion 54. To put it more specifically, the positive inner wire 24 of the first outdoor cable 48 is electrically connected to the negative inner wire 26 of the second outdoor cable 50, while the negative inner wire 26 of the first outdoor cable 48 is electrically connected to the negative inner wire 26 of the indoor cable 52, and while the positive inner wire 24 of the second outdoor cable 50 is electrically connected to the positive inner wire 24 of the indoor cable 52.

As shown in FIG. 9, when the solar cell blocks 38a and 38b are connected in series by the service cable 40, the second serial connector 44 (white) of the service cable 40 is connected to the second connector 22 (black) of the rightmost solar cell module 10f in the module row 36b constituting the block 38a. Meanwhile, the first serial connector 42 (black) of the service cable 40 is connected to the first connector 20 (white) of the rightmost solar cell module 10g in the module row 36c constituting the block 38b.

In short, the connections of the service cable 40 to the solar cell blocks 38a, 38b are done only by connecting the connectors being different in color as well as the connection of the adjacent modules 10, 10. That reduces improper connection of wiring. Further, as described above, the service cable 40 is connected to the blocks 38a, 38b only by the connections of predetermined combinations between the connectors 44, 22, 42, 20. That allows easy working on the roof R.

Herein, the solar cell blocks 38a, 38b in this embodiment are constituted by a plurality of the solar cell modules 10, one module generating a voltage of about 100 volts, connected in parallel. The blocks 38a, 38b also generate a voltage of about 100 volts in total. Therefore, the arrangement structure 100 of the modules 10 in this embodiment generates a voltage of about 200 volts, which is a rated voltage of various devices, by connecting the two solar cell blocks 38a, 38b in series.

As described above, the solar cell modules 10 defined in this application are connected by the first cables 16 and the second cables 18 and further a plurality of the modules 10 connected in parallel constitute the solar cell blocks 38a, 38b, which are connected in series by the service cable 40. The above-mentioned work is easy and simple without improver wiring, thereby arranging a number of modules 10 on the roof. And an output voltage of substantially 200 volts is obtained from the output cable 52 of the service cable 40.

Therefore, according to this invention, a wiring work can be done by anyone even if being not a skilled electrician. For example, skilled workers in high places such as a roof tiler and a carpenter can easily finish a wiring work.

Further, the way such as increasing of the number of unit solar cells 100 of the solar cell panel 12 of the solar cell module 10 can generate a voltage of 200 volts or more. For example, it is possible to generate a voltage of 200 volts to 360 volts.

Figure 11:
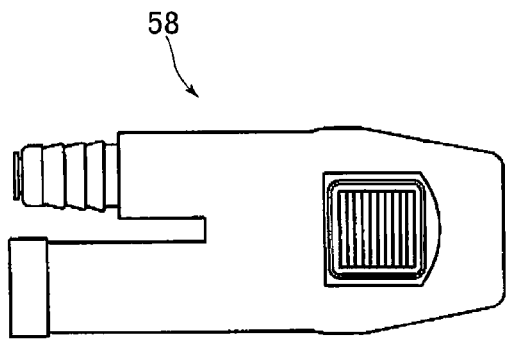
FIG. 11 is a plan view of a terminal protector.

As shown in FIG. 9, the first connector 16 of the rightmost module 10e in the module row 36a and the second connector 18 of the rightmost module 10h in the module row 36d are unused (unconnected) with the blocks 38a, 38b serially connected. According to the arrangement structure 100 in this embodiment, the connectors 16, 18 each are attached with the terminal protector 58 shown in FIG. 11. The terminal protector 58 has the substantially same configuration with the first connector 20 and the second connector 22 of the module 10 except that no cable is connected. In the arrangement structure 100 in this embodiment, the terminal protectors 58 attached to the unused connectors 20, 22 protect the terminals 28, 30 of the unused connectors 20, 22 from adhering of dust or water.

When the arrangement work of the arrangement structure 100 of the modules 10 in this embodiment is interrupted, the terminals 28, 30 of the connectors 20, 22 are protected from adhering of dust or water by attaching the terminal protectors 58 to the unconnected first or second connector 20 or 22, After completion of the work in the step 5 in FIG. 4 as described above, workers pull the indoor cable 52 of the service cable 40 within the house at the step 6. Thereafter, trim tiles are arranged (step 7), the roof R is cleaned (step 8), an inspection is given (step 9), the service cables 40 are banded in the house (step 10), and then the output connector 46 is connected to a splice box (not shown) of the power conditioner (step 11). Thus, a series of procedure is completed.

The solar cell module 10 in the above-mentioned embodiment makes the first cable 16 and the second cable 18 different in color, so as to facilitate determination of the kind of the connectors 20, 22 connected to the respective ends of the first cable 16 and the second cables 18, but the present invention is not limited thereto. For example, the first cable 16 and the second cable 18 may be different in pattern or in a combination of pattern and color, so as to facilitate determination of the kind of the connectors 20, 22. Similarly, the first outdoor cable 48 and the second outdoor cable 50 of the service cable 40 may be different in pattern or in a combination of pattern and color, so as to facilitate determination of the kind of the first serial connector 42 and the second serial connector 44.

Further, the solar cell module 10 in the above-mentioned embodiment, the first connector 20 and the second connector 22 are different in color, but the present invention is not limited thereto. The first connector 20 and the second connector 22 are enough if having a configuration allowing rapid determination of the kind of those by a difference in form such as shape or pattern. For example, it is possible to make one of the first connector 20 and the second connector 22 thicker and the other thereof thinner or one round in a cross section and the other square in cross section.

Similarly, the first serial connector 42 and the second serial connector 44 of the service cable 40 may have a configuration allowing rapid determination of the kind of those by a difference in form such as shape or pattern.

Figure 12A:
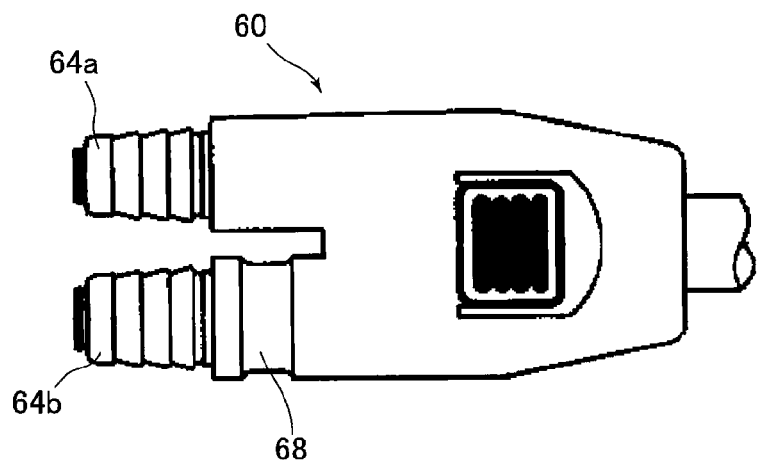
FIG. 12A is a plan view of a connector with male portions at both electrodes and FIG. 12B is a plan view of a connector with female portions at both electrodes.
Figure 12B:
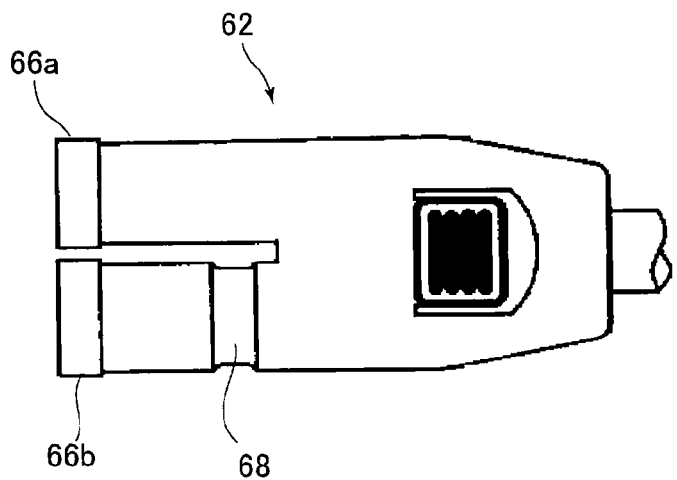
Figure 13:
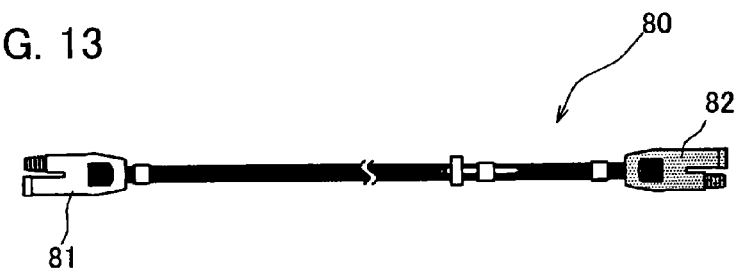
FIG. 13 is a front view of a cable for voltage test.

The first connector 20 and the second connector 22 in the above-mentioned embodiment each have a configuration provided with the female portion 32 and the male portion 34, whose shapes enables to determine the kind of the terminals 28, 30, but the present invention is not limited to such a configuration. For example, as shown in FIG. 12, it is possible to form a pair of engaging configurations composed of a connector 60 with male portions 64a, 64b at both electrodes and a connector 62 with female portions 66a, 66b at both electrodes. In this case, the kind of the electrode is determined by making a form of the male portion 64a (or the female portion 66a) constituting one electrode and a form of the male portion 64b (or the female portion 64b) constituting the other electrode different from each other, and thus improper connection of the connectors 60 and 62 is prevented.

In the connectors 60, 62 in FIG. 12, for example, the one male portion 64b and the one female portion 66b are made thicker than the other male portion 64a and the other female portion 66a, thereby facilitating determination of their electrodes, and whereby the connectors 60, 62 are protected from improper connection. Further, the connectors 60, 62 are protected from improper connection also by forming a groove 68 on each of the one male portion 64b of the connector 60 and the one female portion 66b of the connector 62.

The solar cell panel 12 of the solar cell module 10 in the above-mentioned embodiment generates a voltage of about 100 volts by one panel, but the present invention has no limit to a voltage obtained by the panel 12. The module 10 may be constituted by the solar cell panels 12 that generate a voltage of about 200 volts by one panel. In this case, one solar cell block 38 in which all the modules 10 arranged on the roof R are connected in parallel completes the arrangement structure 100 of the modules 10.

Alternatively, even if the solar cell panel 12 generates a voltage of less than 100 volts by one panel, the arrangement structure 100 of the modules 10 ensures a desired voltage by connecting a predetermined number of solar cell blocks 38 in series.

Further, the solar cell modules 10 in this embodiment are arranged with the cables 16, 18 pulled toward the ridge side. Thus, as well as the general manner to tile a house, the modules 10 are readily arranged from the eaves side to the ridge side of a house. Consequently, even workers being inexperienced in electric work for example readily and orderly wire the cables 16, 18 and arrange the modules 10.

Further, the arrangement structure 100 in this embodiment employs the above-mentioned solar cell modules 10, thereby facilitating wiring of the cables 16, 18 in arrangement and reducing the possibility of breaking of wire caused by twisting of the cables 16, 18 or the like. Still further, in the arrangement structure 100 in this embodiment, the cables 16, 18 of the module 10 are arranged by being pulled toward the ridge side without especial wiring of the cables 16. 18. Therefore, as well as the general manner to tile a house, the arrangement structure 100 in this embodiment facilitates works such as connection of the cables 16, 18 by arranging the modules 10 from the eaves side to the ridge side of a house.

In the solar cell modules 10 in this embodiment, the accommodation space 96 formed on the base 82 is enclosed by the ridge-direction reinforcing portion 92 and the inclining-direction reinforcing portions 94, 94 of the reinforcing heat insulator 90 on three sides. Therefore, the space 96 keeps out air and water from its upper side (ridge side) or its right and left sides when the modules 10 are arranged on a house, so that the terminal box 14 is protected from being wet.

In the solar cell module 10 in this embodiment, the accommodation space 96 is open toward an eaves-side edge 162, so as to be ventilated through the opened part. Therefore, even if the terminal box 14 is subjected to high temperature resulting from power distribution, heat is prevented from accumulating in the space 96, so that a suitable temperature condition is maintained in the space 96.

The solar cell module 10 in this embodiment, as shown in FIG. 3, has a gap 168 around the terminal box 14 in the space 96. That surely prevents heat generated in the terminal box 14 from accumulating in the space 96 and a trouble, such as failure and break of the terminal box 14 caused by the heat, from occurring.

In the solar cell module 10 in this embodiment, the ridge-direction reinforcing portion 92 of the reinforcing heat insulator 90 is made of formed resin. That protects the cables 16, 18 from being subjected to an excess load even if the cables 16, 18 fail to pass through the cable grooves 98 formed in the portion 92 and happen to get stuck in between a top surface of a house and the portion 92. Consequently, the solar cell module 10 surely avoids inconvenience such as breaking of the cables 16, 18.

EXAMPLES

Now, examples of the present invention will be described in detail below.

FIG. 1A is a perspective view of the roof-tile shaped solar cell module employed in the embodiment of the present invention. FIG. 3 is a cross section of the connector of the solar cell module shown in FIG. 1.

The roof-tile shaped solar cell module 10 is an integrated solar cell, in which a plurality of unit solar cells are formed so as to constitute a solar cell as a whole.

Specifically, the module 10 is formed by laminating a film such as a conducting film and a semiconductor film on a glass substrate, cutting a plurality of grooves on the laminated layer so that the layer is divided into a number of one-cell batteries (unit solar cells), and electrically connecting the unit solar cells in series.

The module 10 is of a rectangular shape as shown in figures with the two cables 16, 18 pulled out from a center part of its longer edge. Further, the cables 16, 18 are connected to the connectors 20, 22 respectively.

The cables 16, 18 are different in length, one being long and one being short. Specifically, the long cable 18 has a total length of 50% or more of a total length of the module 10, while the short cable 16 has a total length of less than 50% of the total length of the module 10.

Further, the cables 16, 18 are different in color. The cables 16, 18 each have two electrically-insulated conducting wires 24, 26 (the positive inner wire 24 and the negative inner wire 26). More specifically, the cables 16, 18 each are a cable with the two covered conducting wires 24, 26 arranged in one insulation tube.

The cables 16, 18 are connected to the connectors 20, 22 respectively. The connectors 20, 22 are different in color but have the same configuration in which the two terminals 28, 30 (the pin terminal 28 and the socket terminal 30) are provided as shown in FIG. 3.

The pin terminal 28 is of a pin shape and the socket terminal 30 is of a socket shape.

Further, the connectors 20, 22 each have the female portion 32 and the male portion 34, the pin terminal 28 being formed in the female portion 32 and the socket terminal 30 being formed in the male portion 34.

The connectors 20, 22 are connectable to each other with the female portion 32 of one of the connectors 20, 22 and the male portion 34 of the other thereof connected. When one pair of the female portion 32 and the male portion 34 is connected, the pin terminal 28 of the female portion 32 and the socket terminal 30 of the male portion 34 are connected inside the portions.

In this embodiment, the two covered conducting wires 24, 26 of each of the two cables 16, 18 are connected to the positive electrode and the negative electrode of the solar cell in the module 10 respectively. Specifically, the coated conducting wire 24 in the cable 18 is connected to the positive electrode of the solar cell, while the coated conducting wire 26 therein is connected to the negative electrode of the solar cell. Similarly, the coated conducting wire 24 in the cable 16 is connected to the positive electrode of the solar cell, while the coated conducting wire 26 therein is connected to the negative electrode of the solar cell.

Consequently, one of the two terminals 28, 30 of the connector 22 is connected to the positive electrode of the solar cell, while the other thereof is connected to the negative electrode of the solar cell. Similarly, one of the terminal 28, 30 of the connector 20 is connected to the positive electrode of the solar cell, while the other thereof is connected to the negative electrode of the solar cell.

Herein, the two terminals 28, 30 of the connectors 20, 22 have reverse polarities. Specifically, in the connector 20, the pin terminal 28 has the positive electrode and the socket terminal 30 has the negative electrode. In contrast, in the connector 22, the pin terminal 28 has the negative electrode and the socket terminal 30 has the positive electrode.

Now, the arrangement structure of the roof-tile shaped solar cell module 10 described above will be described in detail below.

FIG. 6 is a conceptual diagram showing the modules 10 properly connected. FIG. 7 is a conceptual diagram showing the modules 10 improperly connected. FIG. 8 is a circuit diagram of wiring in which the modules 10 are properly connected.

The above-mentioned modules 10 are, as shown in FIGS. 5 and 6, are arranged on a structural subject such as a roof by lining up in one row sideways.

Then, the connectors 20, 22 of adjacent modules 10 are connected. Looking at one module 10, the connector 22 of said module 10 is connected to the connector 20 of the module 10 located to its immediate left. The connector 20 of said module 10 is connected to the connector 22 of the module 10 located to its immediate right.

To explain with focusing on the lengths of the cables, the connector 22 of the long cable 18 of said module 10 is connected to the connector 20 of the short cable 16 of the module 10 located to its immediate left. The connector 20 of the short cable 16 of said module 10 is connected to the connector 22 of the long cable 18 of the module 10 located to its immediate right.

As a result, as shown in FIG. 8, the solar cells are connected in parallel.

In contrast, because of improper connection, as shown in FIG. 7, connection of the connectors 22 of the long cables 18 renders the other connectors 20 physically unable to connect, and whereby workers notice the improper connection. That is because the connector 20 is connected to the short cable 16, which has a length less than a half of the total length of the module 10. Further, since the cables 16, 18 each are pulled out from the center part of the module 10, the short cables 16 are lack of length, thus being unconnectable to each other.

Consequently, the roof-tile shaped solar cell modules 10 in this embodiment are never wired improperly.

The invention claimed is:

1. A solar cell module having a substantially rectangular shape with longer edges and shorter edges, comprising:
    a solar cell panel formed in a substantially rectangular plane with longer edges and shorter edges by electrically connecting a plurality of unit solar cells in series;
    a first cable and a second cable being different in length and each having more than one conducting wire;
    a solar cell arranging portion, the solar cell arranging portion being planate and of a substantially same dimension as the solar cell panel, the solar cell panel arranged on the solar cell arranging portion;
    a terminal box inserted through an opening in the solar cell arranging portion and positioned such that the first cable and the second cable extend from the terminal box through a center groove, the center groove extending from a region adjacent a first end of the opening across the solar cell module and having a center groove end located substantially at a center part of one of the longer edges of the module;
    two connectors consisting of a first connector connected to an end of the first cable and a second connector connected to an end of the second cable and being connectable by engagement with the first connector;
    two positive conducting wires in electrical connection with a positive electrode of the solar cell panel;
    two negative conducting wires in electrical connection with a negative electrode of the solar cell panel; and
    at least one side groove located at a predetermined interval from the center groove,
    the first cable having two conducting wires consisting of one of the two positive conducting wires and one of the two negative conducting wires and arranged in an insulation tube,
    the second cable having two conducting wires consisting of the other of the two positive conducting wires and the other of the two negative conducting wires and arranged in an insulation tube, and
    the first and the second cables being pulled out from the center groove end,
    wherein the solar cell panel has a length L1 of the longer edges and a length L4 of the shorter edges, the second cable having a pulled-out portion, the pulled-out portion measured from the center groove end to the second connector and being of a length X longer than (L1/2) and longer than L4,
    the first cable having a pulled-out portion, the pulled-out portion measured from the center groove end to the first connector and being of a length Y shorter than a length of the second cable and shorter than (L1/2),
    the second cable having the length X longer than a sum of (L1/4) and L4 and shorter than a sum of ((L1/4)×3) and L4, and
    wherein the second cable is one of a plurality of second cables, the side groove holding another of the second cables.

2. The solar cell module as defined in claim 1,
    having a length L2 of the shorter edges,
    the first cable having the length Y shorter than the length L2.

3. The solar cell module as defined in claim 1,
    having a space for accommodating the first and second cables and connectors in a back of the module.

4. The solar cell module as defined in claim 3,
    having grooves through which the first and second cables are inserted in a shorter-edge direction in the back of the module.

5. The solar cell module as defined in claim 1,
    wherein the long cable has a length of 50% or more of a total length of the solar cell module and the short cable has a length of less than 50% of the total length thereof.

6. The solar cell module as defined in claim 1,
    wherein the first and the second connectors each comprises a positive terminal connected to a respective positive conducting wire, a negative terminal connected to a respective negative conducting wire, a male portion, and a female portion connectable by engagement with the male portion,
    the first and the second connectors are composed of one provided with the positive terminal formed in the male portion and the negative terminal formed in the female portion and the other provided with the negative terminal formed in the male portion and the positive terminal formed in the female portion.

7. The solar cell module as defined in claim 1,
    having a plus electrode-connecting terminal in electrical connection with the positive electrode of the panel and a minus electrode-connecting terminal in electrical connection with the negative electrode of the panel,
    wherein the two positive conducting wires are connected to the plus electrode-connecting terminal and the two negative conducting wires are connected to the minus electrode-connecting terminal.

8. The solar cell module as defined in claim 1,
    wherein the first connector and the second connector are different in pattern and/or color.

9. The solar cell module as defined in claim 1,
    wherein the first cable and the second cable are different in pattern and/or color.

10. The solar cell module as defined in claim 1,
    wherein the positive conducting wires and the negative conducting wires are different in pattern and/or color.

11. The solar cell module as defined in claim 1,
    the solar cell panel being of a substantially rectangular shape,
    wherein, when two solar cell modules are arranged by adjacently connecting the shorter edges of the panels, the first connector of one of the modules is unconnectable to the first connector of the other of the modules because the cables are not long enough.

12. The solar cell module as defined in claim 1,
    wherein the connectors have the same configuration but are different in color.

13. The solar cell module as defined in claim 1,
    wherein the long cable and the short cable are different in color.

* * * * *